United States Patent [19]

Dahm et al.

[11] Patent Number: 5,583,789
[45] Date of Patent: Dec. 10, 1996

[54] LOCAL INTEGRAL METHOD FOR COMPUTING MOLECULAR DIFFUSION AND CHEMICAL REACTION

[75] Inventors: Werner J. A. Dahm; Grétar Tryggvason, both of Ann Arbor, Mich.

[73] Assignee: Gas Research Institute, Chicago, Ill.

[21] Appl. No.: 99,864

[22] Filed: Jul. 30, 1993

[51] Int. Cl.$^6$ .................................................. G06F 17/00
[52] U.S. Cl. ........................... 364/496; 364/499; 364/578
[58] Field of Search ...................................... 364/496, 578, 364/499; 436/2, 34, 106, 116, 147, 148, 157; 23/306, 307

[56] References Cited

U.S. PATENT DOCUMENTS

| | | | |
|---|---|---|---|
| 4,972,334 | 11/1990 | Yamabe et al. | 364/200 |
| 5,029,119 | 7/1991 | Konno | 364/578 |
| 5,129,035 | 7/1992 | Saji et al. | 395/1 |
| 5,148,379 | 9/1992 | Konno et al. | 364/578 |

OTHER PUBLICATIONS

C. H. H. Chang, W. J. A. Dahm and G. Tryggvason, "Lagrangian Model Simulations of Molecular Mixing, Including Finite Rate Chemical Reactions, in a Temporally Developing Shear Layer", *Physics of Fluids A*, vol. 3, pp. 1300–1311, 1991.

G. Tryggvason and W. J. A. Dahm, "An Integral Method for Mixing, Chemical Reactions, and Extinction in Unsteady Strained Diffusion Layers", *Combustion & Flame,* vol. 83, pp. 207–220, 1991.

*Primary Examiner*—Emanuel T. Voeltz
*Assistant Examiner*—Patrick J. Assouad
*Attorney, Agent, or Firm*—Speckman, Pauley & Fejer

[57] ABSTRACT

A local integral method for computing molecular diffusion and chemical reaction within a material wherein shape and time evolution values of one or more material surfaces are computed, and a rate of stretch of each material surface is determined as a function of time. A set of ordinary differential equations are solved at a multiplicity of points on the material surface. The ordinary differential equations are reduced from and represent an approximation of a more complex and complete set of governing partial differential equations. One or more conserved scalars are tracked and conserved scalar values and a gradient of the conserved scalars are determined. A rate of change from the gradient of the conserved scalars is also determined. A mass fraction and a reaction rate of each chemical species of the material is correlated as a function of determined conserved scalar values and a determined gradient of the conserved scalars. The local integral method of this invention is particularly useful as a general tool for simulating nitrogen oxides output and other flame properties of a wide class of combustion applications.

2 Claims, 27 Drawing Sheets

LOCAL INTEGRAL METHOD FOR COMPUTING MOLECULAR DIFFUSION AND CHEMICAL REACTION

BACKGROUND OF THE INVENTION

1. Field of the Invention

This invention relates to a method or computational model for solving a set of ordinary differential equations that are reduced from and represent an approximation of a more complex and complete set of governing partial differential equations, thereby allowing computational modeling of complex physical processes at work in turbulent flames.

2. Description of Prior Art

Flame properties typically of interest, particularly when considering development of turbulent flames producing low nitrogen oxides ($NO_x$) emissions for natural gas burning applications in industry and utilities, include: overall pollutant emission levels, of which $NO_x$ are one primary concern; flame liftoff and blowout stability characteristics; heat release patterns within flames; and even flame geometries. Aside from such global flame characteristics, detailed information available from a combustion code, such as identification of areas or zones of high pollutant formation rates within the flame can be used as a tool for designing low $NO_x$ flames.

Computational requirements for numerically solving the complete governing equations that determine fluid motion and reaction chemistry in turbulent flames far exceed the capabilities of most modern computers. For this reason, conventional numerical calculations of combustion characteristics in turbulent flames are based on time-averaged versions of the governing equations, the mathematical nature of which requires that turbulence modeling be incorporated into such calculations to solve the equations. Many conventional turbulence models function under an assumption that mixing between fuel and oxidant in turbulent flames is a gradient transport process. However, such conventional turbulent flame codes based upon such assumptions have proven unreliable for predicting many important and sensitive combustion phenomena resulting from various designs of natural gas burning equipment, including crucial flame properties such as in-flame $NO_x$ levels and flame stability limits. Such conventional combustion codes are of limited utility for exploring large design changes for achieving desired turbulent flame properties, such as $NO_x$ reduction, increased flame stability, and increased flame radiation.

Strict requirements for low $NO_x$ emission levels in gas burning applications suggest that significant departures from conventional designs are necessary to meet these stringent requirements. It will be necessary to analyze complex and detailed physical processes governing combustion and $NO_x$ formation in turbulent flames.

SUMMARY OF THE INVENTION

It is one object of this invention to provide a method associated with gas combustion, particularly suitable for industry and utilities, that permits detailed computational modeling of complex physical processes at work in turbulent flames, which in turn provides reliable assessments of $NO_x$ levels and other flame properties.

The model or method according to this invention can be used as a computational tool for meeting stringent environmental requirements placed on current and future gas burning applications. It is essential to note that the turbulent flame model according to this invention is fundamentally different, both in terms of the underlying physical assumptions on which it is based and the numerical techniques used for their implementation, from conventional turbulent models commonly used for treating combustion in turbulent flames.

The method according to this invention is not based on time-averaged versions of the complete governing equations for fluid motion and combustion chemistry. Instead, the method according to this invention directly incorporates physically-correct approximations motivated by a new understanding of fundamental physics of gas combustion in turbulent flames together with other physically justifiable approximations, into the complete governing equations to bring them within-reach of current computational capabilities. According to the method of this invention, many detailed fine-scale processes at work in turbulent combustion are comparatively well understood and do not require continuous recomputation in precise detail. Experiments conducted according to the method of this invention have shown that this method can be incorporated directly into the complete governing equations to bring the modeling of turbulent flames within computational reach. The method according to this invention simplifies the complexity associated with computational modeling of turbulent flames and such approximations have been incorporated into a new type of model for gas combustion in turbulent flames. The method according to this invention can be used as a very general tool which is capable of simulating $NO_x$ output and other flame properties of a wide class of combustion applications. The method of this invention is not limited to only one specific type of flame or to a narrow class of flames.

The method for entrainment, mixing and combustion processes in turbulent flames, according to this invention, is based upon a Local Integral Method (LIM) approach for accurately and quickly dealing with the underlying complex advection-diffusion-reaction processes in flames. It has been determined that the advection-diffusion balance in turbulent flows leads to the formation of thin layer-like regions within which essentially all molecular mixing occurs. Highly detailed experimental measurements have shown that the internal structure of such layers is self-similar, which means that the shape of the chemical species profiles within these layers is always of a mathematically similar type, and only certain relatively simple global properties of the profile vary from one point to another. Such global properties are determined by various moments of the local profile, and therefore determination of the detailed chemical species and reaction rate profiles throughout the flow requires only computational evolution of such local integral moments. Thus, the method according to this invention is used to determine the time evolution of the material interface on, which such moments reside and the evolution of the moments on such surface. The computational code according to this invention is considerably faster than any conventional direct simulation since the method of this invention involves numerical solution of ordinary differential equations rather than numerical solution of the original partial differential equations.

The, LIM model according to this invention is separated into both a fluid dynamics model and a combustion model. The fluid dynamics model determines the underlying flow field and the evolution of the material surface within it. The combustion model treats the molecular mixing and chemical reactions occurring in the flow.

The combustion model of this invention tracks the evolution of the molecular mixing and chemical reactions among all necessary conserved scalar fields and chemical species fields, as well as the associated temperature field, throughout the region of interest in the flow. Such integral method allows the governing conservation equations to be solved up to several orders of magnitude faster than if conventional methods are used. From highly detailed imaging measurements ((1) Dahm, W. J. A. and Buch, K. A., "High Resolution, Three-dimensional (2563), Spatio-temporal Measurements of the Conserved Scalar Field in Turbulent Shear Flows", *Turbulent Shear Flows* 7, pp. 17–26, W. C. Reynolds, Ed., Springer Verlag, Berlin, 1991; (2) Dahm, W. J. A., Southerland, K. B. and Buch, K. A., "Four-dimensional Laser Induced Fluorescence Measurements of Conserved Scalar Mixing in Turbulent Flows", *Applications of Laser Techniques to Fluid Mechanics*, pp. 3–18, R. Adrian, Ed., Springer Verlag, Berlin, 1991; (3) Dahm, W. J. A. and Buch, K. A., "Fine Structure Characteristics of Large Schmidt Number Molecular Mixing in Turbulent Flows", *Chemical Reactions and Physical Processes in Turbulent Liquids*, J. Hunt, Ed., Cambridge University Press, in press; (4) Dahm, W. J. A., Southerland, K. B. and Buch, K. A., "Direct High Resolution, Four-dimensional Measurements of the Fine Scale Structure of Sc>>1 Molecular Mixing in Turbulent Flows", *Phys. Fluids A* 3, 1115–1127, 1991; and (5) Dahm, W. J. A. and Southerland, K. B., "Quantitative, Four-dimensional, Laser Induced Fluorescence Imaging Studies of Scalar Mixing in Turbulent Flows," *Flow Visualization* 6, pp. 243–247, Springer-Verlage, Berlin, 1992) it has been determined that the advection-diffusion balance in turbulent flows leads to the formation of thin layer-like regions in which essentially all molecular mixing occurs. These measurements have further shown that the internal structure of the mixing process in such layers, as quantified for example by a conserved scalar quantity, is essentially self-similar, thus forming one major physical basis of the method according to this invention. By being mathematically self-similar, it is intended to mean that various parameters describing the internal structure along the local normal to the layer, such as the species concentration profile width, shift, magnitude and-the like, may vary from point to point along the layer and with time, while the fundamental shape of the profile does not change otherwise. Consequently, according to the method of this invention, it is not necessary to continually recompute the detailed internal structure of the species profiles within such layers, and instead these can be specified as a family of self-similar profile shapes with any desired number of degrees of freedom. The changes in these degrees of freedom, describing the evolution of the mixing and reaction processes locally within such layers, are determined by various integral moments of the local profiles. These integral moments are evolved in time over the itself-evolving material surface to satisfy the parabolized forms of the complete governing species conservation equations and the energy equation subject to the local strain rate determined from the local rate of change of material surface area.

These integral moments of any order n can be defined for any intermediate radical species denoted by species index j as $$C_n^j = \int c_j y^n dy \quad n = 0, 1 \ldots \qquad \text{Eqn. 1}$$

where y denotes the local layer-normal coordinate. An analogous definition can be employed for the temperature profile. For the reactant species, mathematical convergence of the moments requires working in terms of the reactant gradient profile, for which the corresponding integral moments can be defined as $$R_n^j = \int \frac{\partial c_j}{\partial y} y^n dy \quad n = 0, 1 \ldots \qquad \text{Eqn. 2}$$

The general forms of the LIM equations for these integral moments are then obtained by the following procedure: (1) parabolization of the original governing partial differential equations which describe the advection-diffusion-reaction processes in such layers, justified by the fact that derivatives along the layers are much smaller than derivatives across the layers, (2) multiplication of the parabolized equations by the layer-normal coordinate raised to the $n^{th}$ power, and (3) integration of the resulting expressions over the entire range of n. This procedure produces the LIM equations of order n. The reaction terms in these equations result in integrals, termed the reaction integrals, evaluation of which require specific profile shapes to be specified as a family of self-similar shapes each parameterized by a finite set of chosen quantities (degrees of freedom), said quantities in turn being mathematically expressible in terms of the integral moments themselves. The LIM equations beginning at order unity and extending up to the same order as the number of degrees of freedom in the chosen family of profile shapes then constitutes the set of ordinary differential equations to be solved. These equations, up to order four, are shown below for the intermediate species:

$$\frac{dC_0^j}{dt} = -\sigma C_0^j + \sum_{i=1}^{4} v_{ij} \int w_i \, dy \qquad \text{Eqn. 3}$$

$$\frac{dC_1^j}{dt} = -2\sigma C_1^j + \sum_{i=1}^{4} v_{ij} \int w_i \, y \, dy \qquad \text{Eqn. 4}$$

$$\frac{dC_2^j}{dt} = -3\sigma C_2^j + 2DC_0^j + \sum_{i=1}^{4} v_{ij} \int w_i \, y^2 \, dy \qquad \text{Eqn. 5}$$

$$\frac{dC_3^j}{dt} = -4\sigma C_3^j + 6DC_1^j + \sum_{i=1}^{4} v_{ij} \int w_i \, y^3 \, dy \qquad \text{Eqn. 6}$$

for the reactants species gradients:

$$R_0^j = C_R - C_I \qquad \text{Eqn. 7}$$

$$\frac{dR_1^j}{dt} = -\sigma R_1^j - \sum_{i=1}^{4} v_{ij} \int w_i \, dy \qquad \text{Eqn. 8}$$

$$\frac{dR_2^j}{dt} = -2\sigma R_2^j + 2DR_0^j - 2 \sum_{i=1}^{4} v_{ij} \int w_i \, y \, dy \qquad \text{Eqn. 9}$$

$$\frac{dR_3^j}{dt} = -3\sigma R_3^j + 6DR_1^j - 3 \sum_{i=1}^{4} v_{ij} \int w_i \, y \, dy \qquad \text{Eqn. 10}$$

and for the temperature:

$$\frac{dQ_0}{dt} = -\sigma Q_0 + He \sum_{j=1}^{7} M_j h_j \left[ \sum_{i=1}^{4} v_{ij} \int w_i \, dy \right] \qquad \text{Eqn. 11}$$

$$\frac{dQ_1}{dt} = -2\sigma Q_1 + He \sum_{j=1}^{7} M_j h_j \left[ \sum_{i=1}^{4} v_{ij} \int w_i \, y \, dy \right] \qquad \text{Eqn. 12}$$

$$\frac{dQ_2}{dt} = -3\sigma Q_2 + 2DQ_0 + He \sum_{j=1}^{7} M_j h_j \left[ \sum_{i=1}^{4} v_{ij} \int w_i \, y^2 \, dy \right] \qquad \text{Eqn. 13}$$

$$\frac{dQ_3}{dt} = -4\sigma Q_3 + 6DQ_1 + He \sum_{j=1}^{7} M_j h_j \left[ \sum_{i=1}^{4} v_{ij} \int w_i \, y^3 \, dy \right] \qquad \text{Eqn. 14}$$

This procedure replaces the original problem of solving a set of partial differential equations in the entire volume of space with a set of ordinary differential equations that need only to be solved on the evolving material surface. Thus according to the method of this invention, it is not necessary to solve a partial differential equation. According to the method of this invention, ordinary differential equations are solved and thus increase computational efficiency. Each of the individual species concentration fields can then be reconstructed from such integral moments using any of many techniques, for example a boundary integral method or a Peskin-like method.

Computational results have shown that the integral method according to this invention is capable of modeling the evolution of chemical species in isolated as well as interacting diffusion and reaction layers, even under relatively strong time-varying strain rate fields representative of combustion in turbulent flames. Results according to the method of this invention are typically within a few percent of full finite difference calculations. Computational results have also shown that the model according to this invention can correctly capture even such important and highly sensitive non-linear combustion phenomena as local extinction of reactions in the flow due to finite rate chemical kinetics when the local strain rate in the flow becomes sufficiently large.

The LIM model according to this invention has been developed as a very general technique, in principle capable of handling an arbitrarily large set of reacting species coupled through their resulting reaction integrals. Each species can be assigned a separate, temperature-dependent bulk diffusivity, allowing treatment of major effects of differential diffusion.

The LIM model of this invention allows very rapid calculations of nonequilibrium combustion in flames via a conserved scalar formulation and a nonequilibrium flamelet library. Calculations based on complex chemical kinetics in a canonical reaction configuration, such as an isolated molecular diffusion and reaction layer, are conducted a priori to produce a quasi-universal tabulation, or library, of the species concentrations and reaction rates versus conserved scalar and dissipation rate values. This LIM model then computes the conserved scalar and dissipation rate values throughout the flame, which when coupled with the reaction library permit species concentration and reaction rates to be generated throughout the flame. Only a single nonreactive species must be tracked. The LIM equations for the evolution of this conserved scalar field contain no reaction integrals, so the only modeling required is in the interaction of neighboring advection-diffusion layers. This extension of the LIM model to flamelet chemistry provides a method for greatly reducing the amount of computation required to treat nonequilibrium combustion problems. Computations using multiple conserved scalars also allow differential diffusivity effects to be incorporated.

The fluid dynamics model is used to determine the time evolution of the velocity field throughout a region of interest in the flow. According to this invention, the velocity field is linearly separated into curl-free and divergence-free parts, each of which can be determined separately and recombined to determine the complete velocity field. The divergence-free part of the flow, namely the vorticity vector field, is tracked using discrete vortex elements which locally satisfy similar parabolized forms of the governing equations, as in the combustion model previously described. According to the method of this invention, only a single vorticity element is specified across each local vortex layer in the flow, which greatly reduces computational time necessary for the flow field calculation. For example, an $N^2$-algorithm typically produces time savings of between 1 and 2 orders of magnitude in comparison with existing vortex tracking methods, which require multiple elements across the vortex layers. The vorticity profile along the local normal to underlying vortex layers in the flow is taken as self-similar and modeled using a family of self-similar profile shapes. The curl-free part of the velocity field, namely the volumetric expansion due to heat release, can be tracked using discrete volume source elements and locally evolved from the temperature field using the same type of local integral method. The strain rate field over the material surface on which these integral moments are computed as described above is then determined from deformation of the surface by the resulting total velocity field. This deformation in turn drives the molecular mixing and chemical reaction processes in the combustion model.

Generally speaking, a coupling in both directions exists between the fluid dynamics model and the combustion model, which is often referred to as turbulence-combustion interactions. The method of this invention can account for such turbulence-combustion interactions by coupling from the fluid dynamics model to the combustion model which occurs through the strain rate field. The coupling back from the combustion model to the fluid dynamics model occurs through the volume source field resulting from the fluid expansion due to combustion heat release. As noted above, the local strain rate field is directly obtained by differentiation of the velocity field determined in the fluid dynamics model, while the local rate of change of the temperature field in the combustion model determines the local volume source strength. In certain applications of the method of this invention, the effects of the volume source field may be of lesser importance and may be neglected.

The LIM model according to this invention provides a previously inaccessible level of detailed information about the combustion process in flames to be obtained at a relatively low computational cost. Results obtained provide a tool for designing flames to achieve specified combustion characteristics and pollutant emissions levels.

BRIEF DESCRIPTION OF THE DRAWINGS

This invention and the various embodiments will be described in further detail in conjunction with the drawings wherein:

FIGS. 31 and 32 are graphical representations showing the effect of the local strain rate on the shape and magnitude of the species concentration and reaction rate libraries for OH;

FIG. 36 is a graphic visualization showing the OH mass fraction field computed by the LIM model according to this invention, via the scalar and scalar dissipation rate fields shown in FIGS. 26a and 26b, the strain rate mapping shown in FIG. 29, and the OH mass fraction library shown in FIG. 30a;

DESCRIPTION OF PREFERRED EMBODIMENTS

Figure 2:
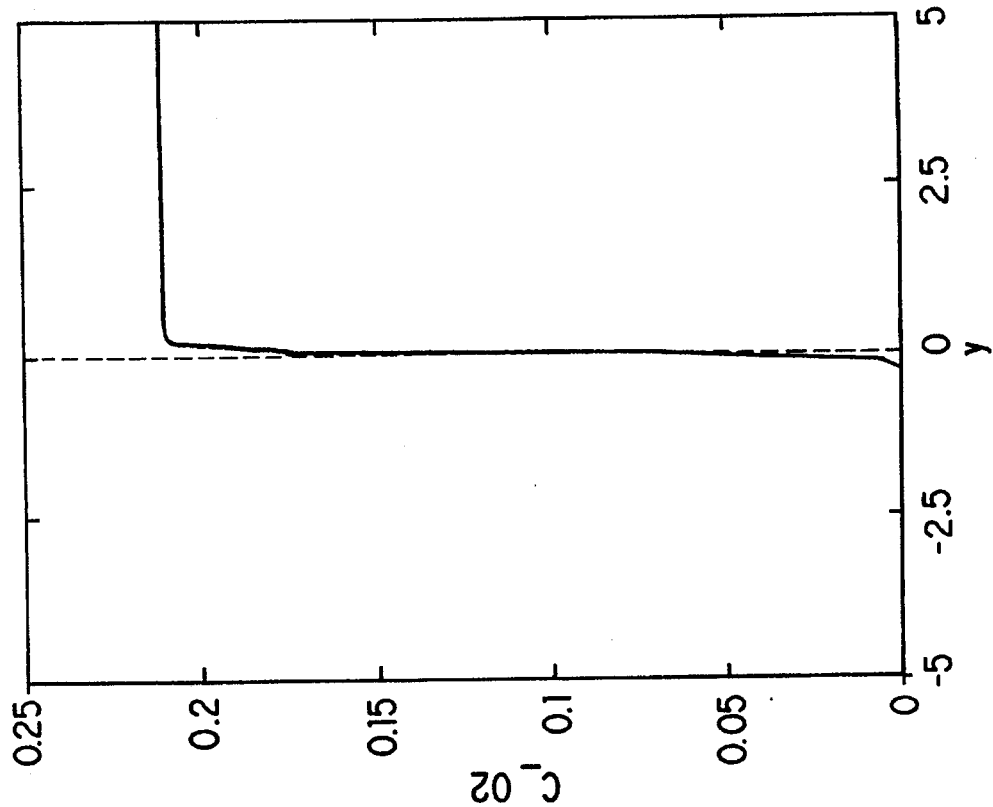
FIGS. 1–4 are graphical representations showing initial conditions for both LIM model calculations according to this invention, and finite difference calculations used to assess results obtained from the LIM model according to this invention.
Figure 1:
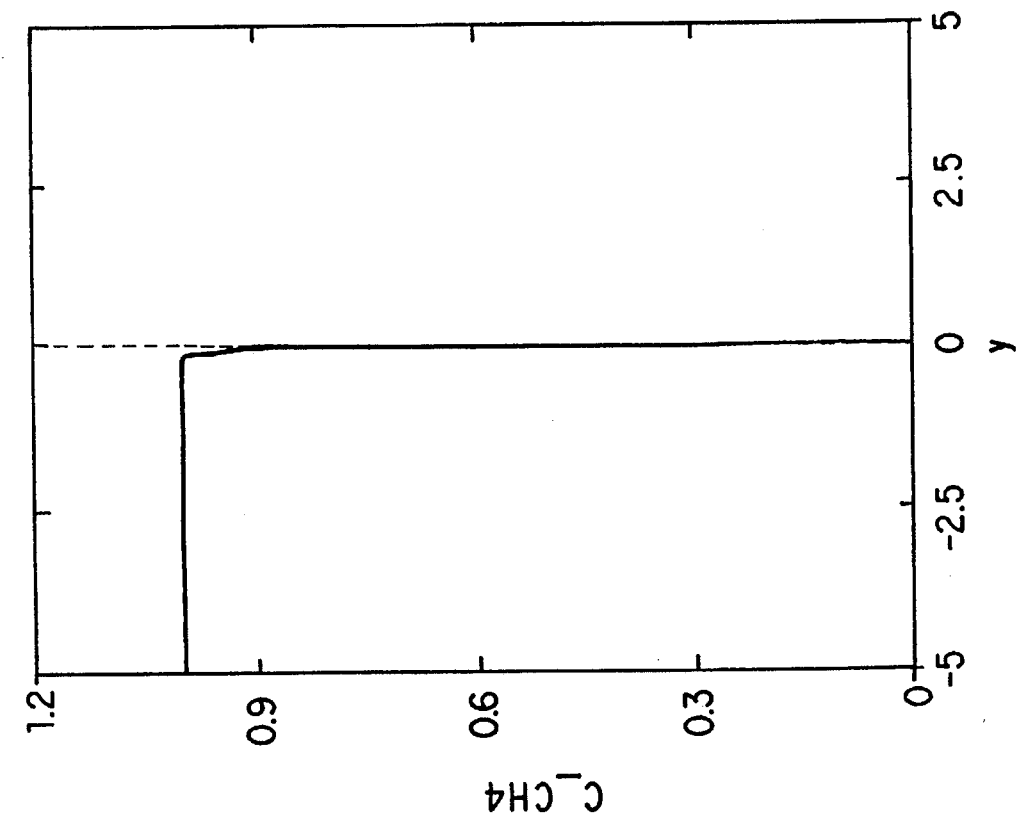
Figure 4:
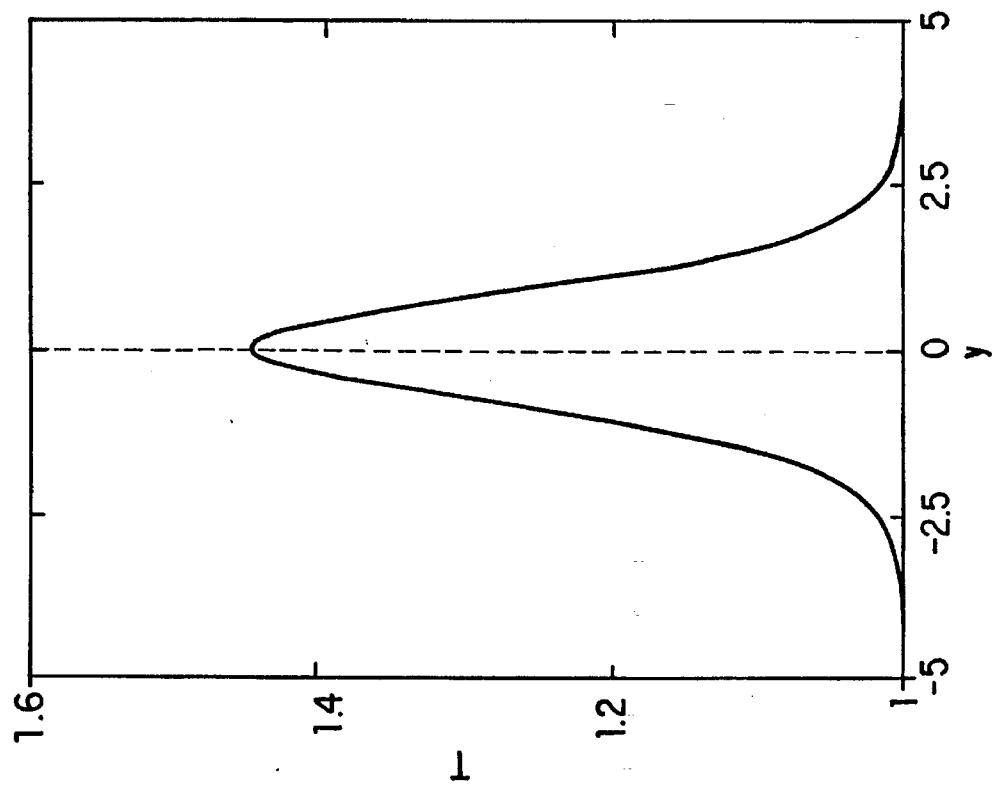
Figure 3:
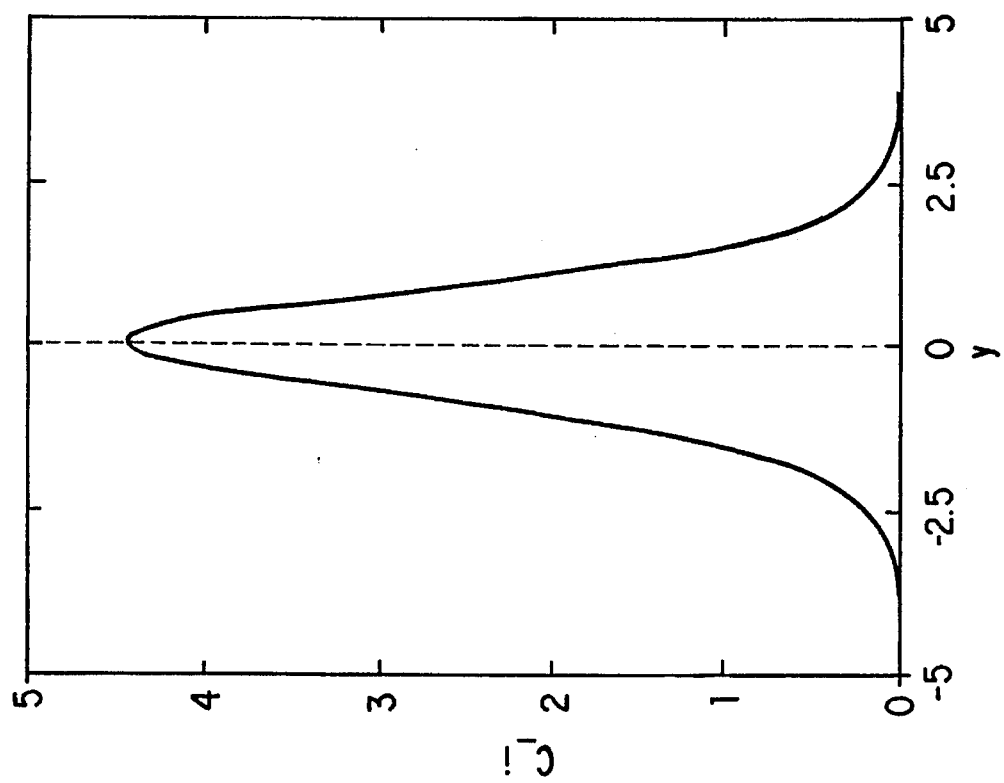
Figure 6:
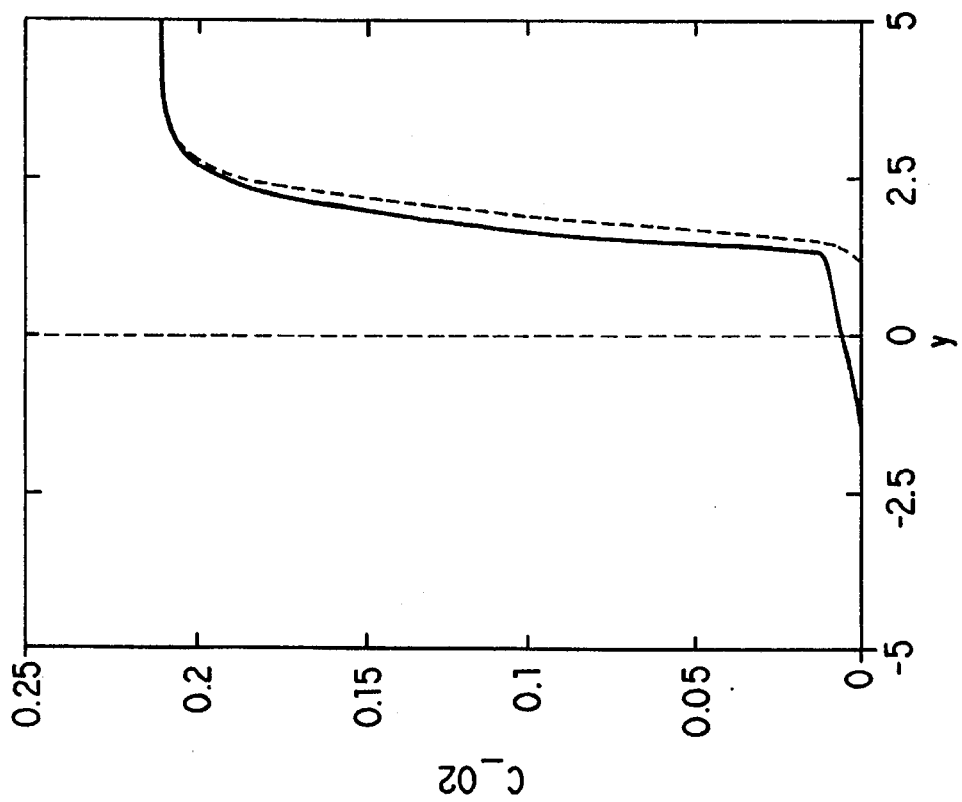
FIGS. 5–12 are graphical representations showing results from the LIM model according to this invention for internal profiles of $CH_4$, $O_2$, $N_2$, $H_2O$, $CO$, $CO_2$, $H_2$, and H, respectively, for an isolated methane-air diffusion and reaction layer.
Figure 5:
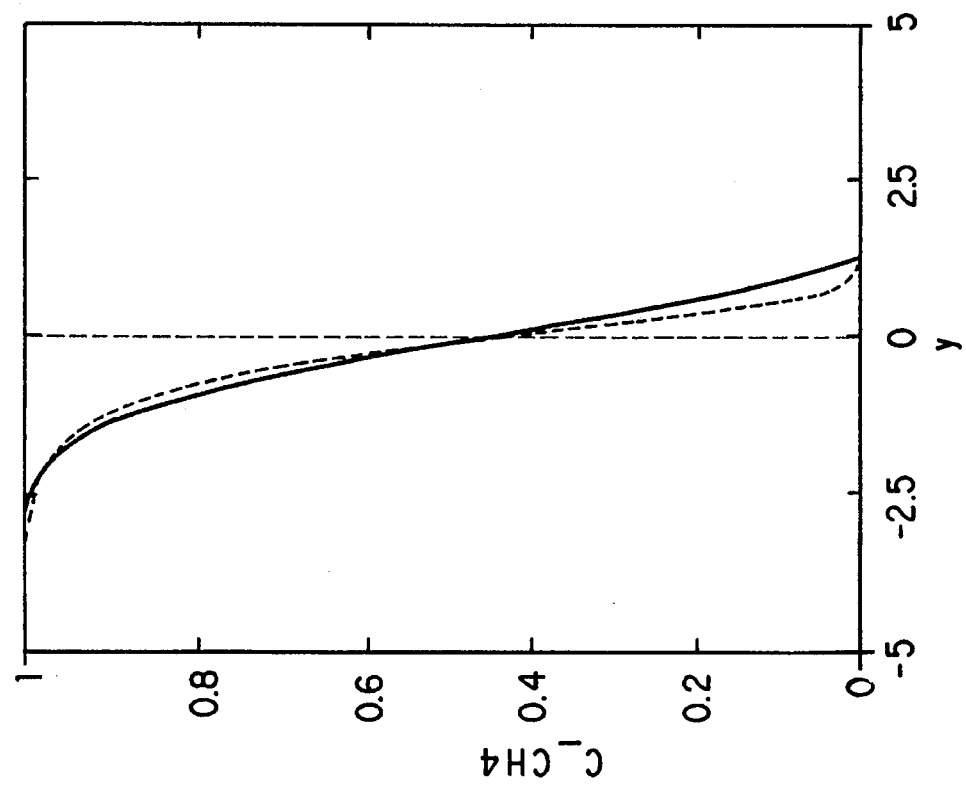
Figure 8:
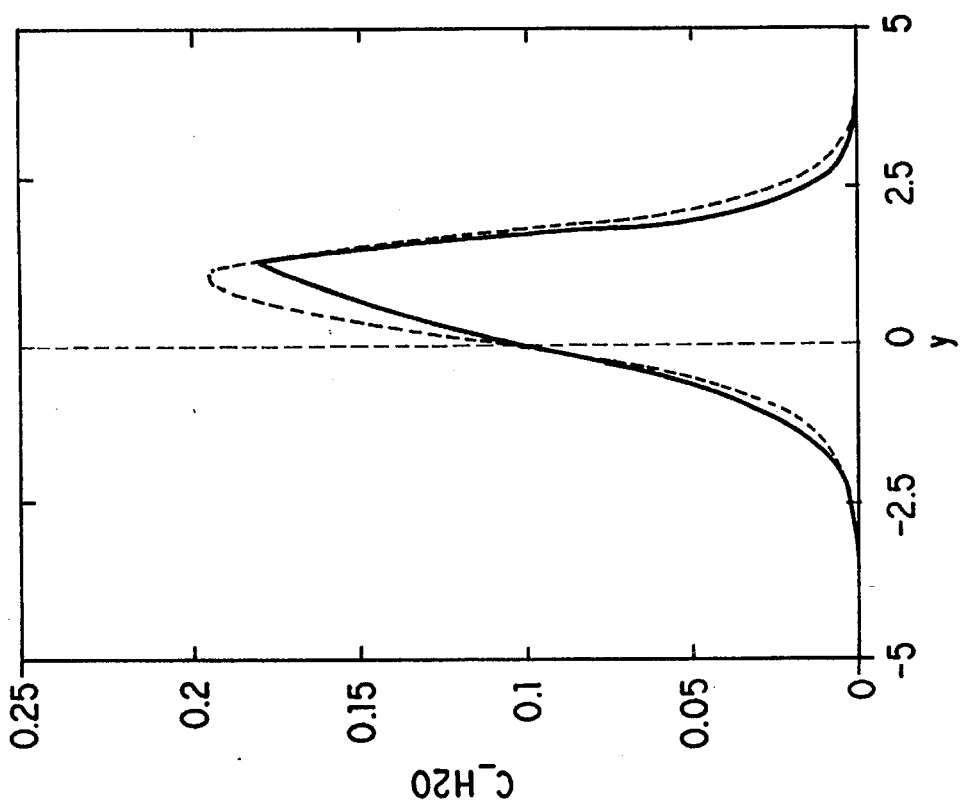
Figure 7:
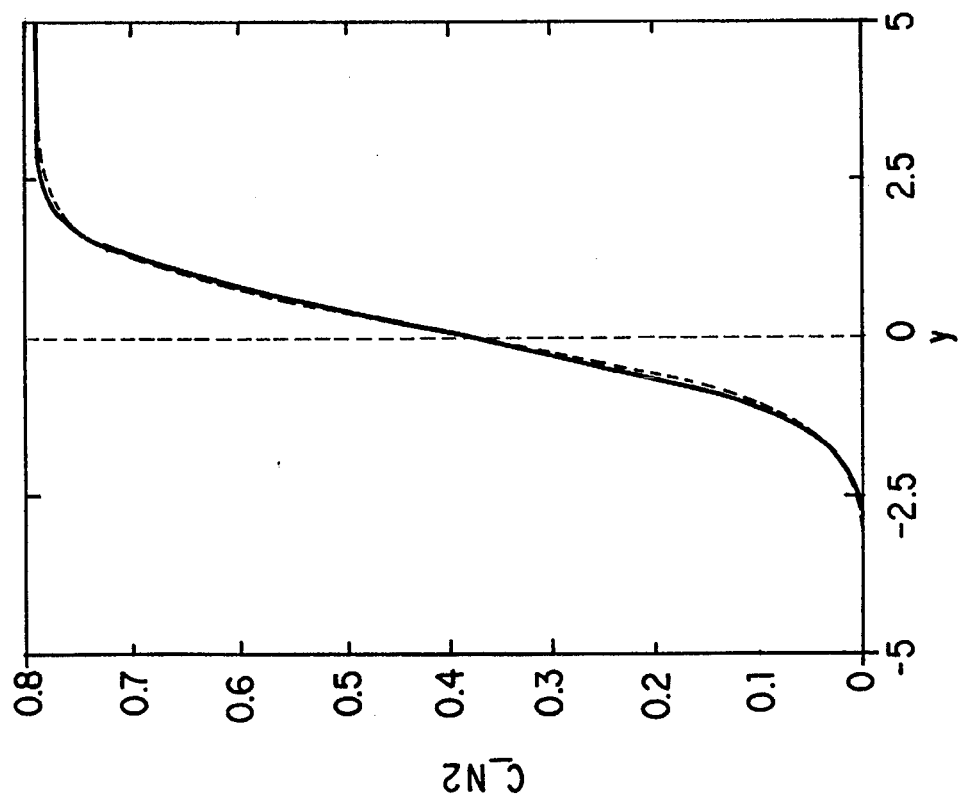
Figure 10:
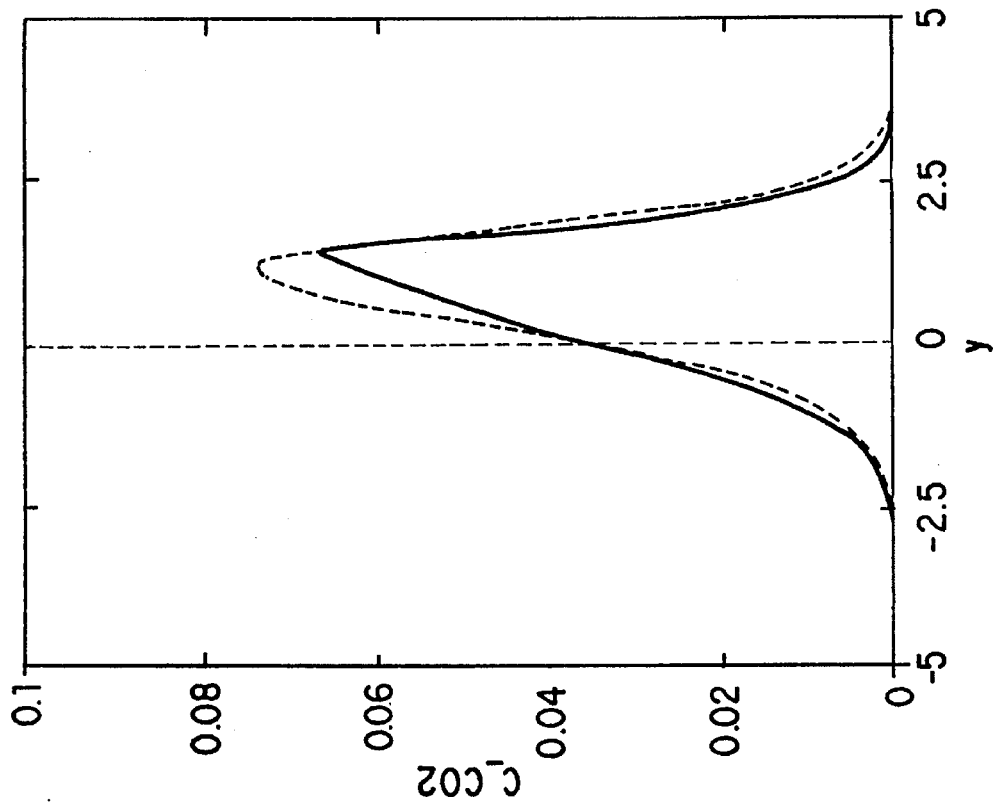
Figure 9:
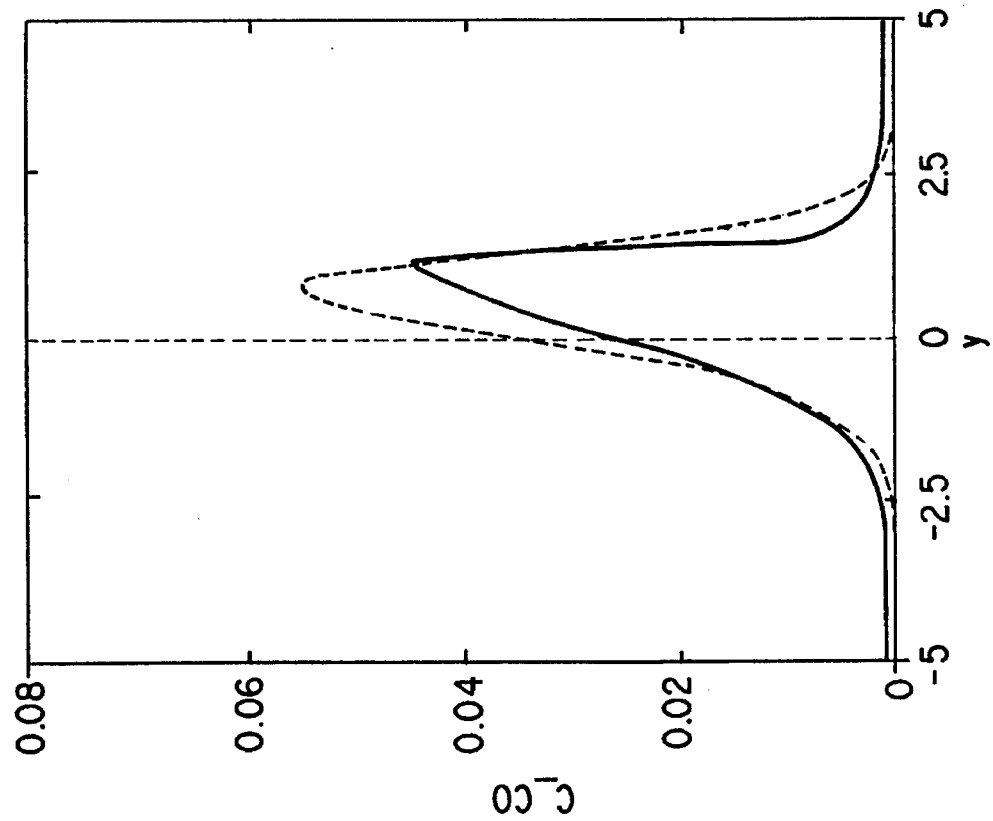
Figure 12:
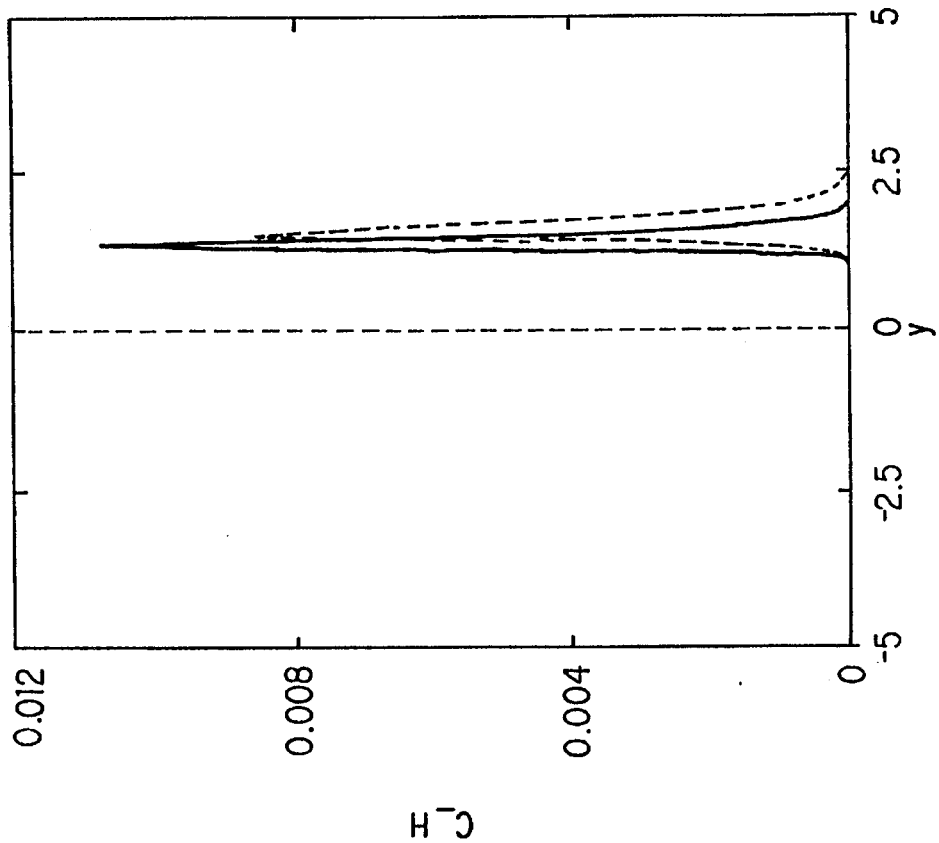
Figure 11:
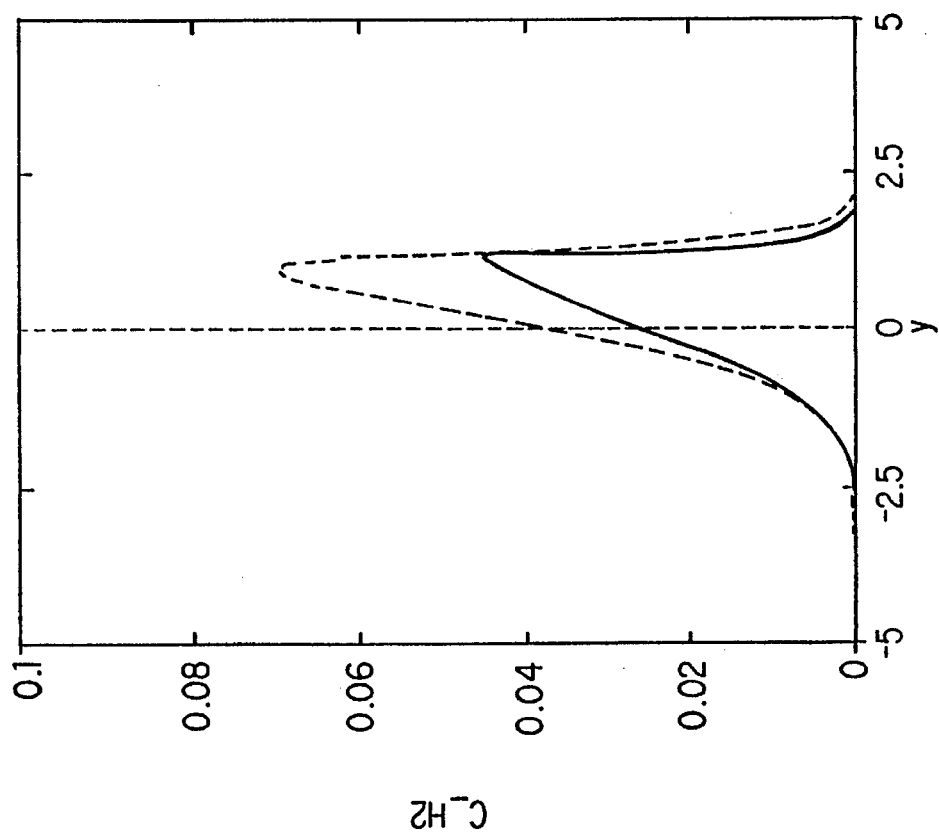
Figure 14:
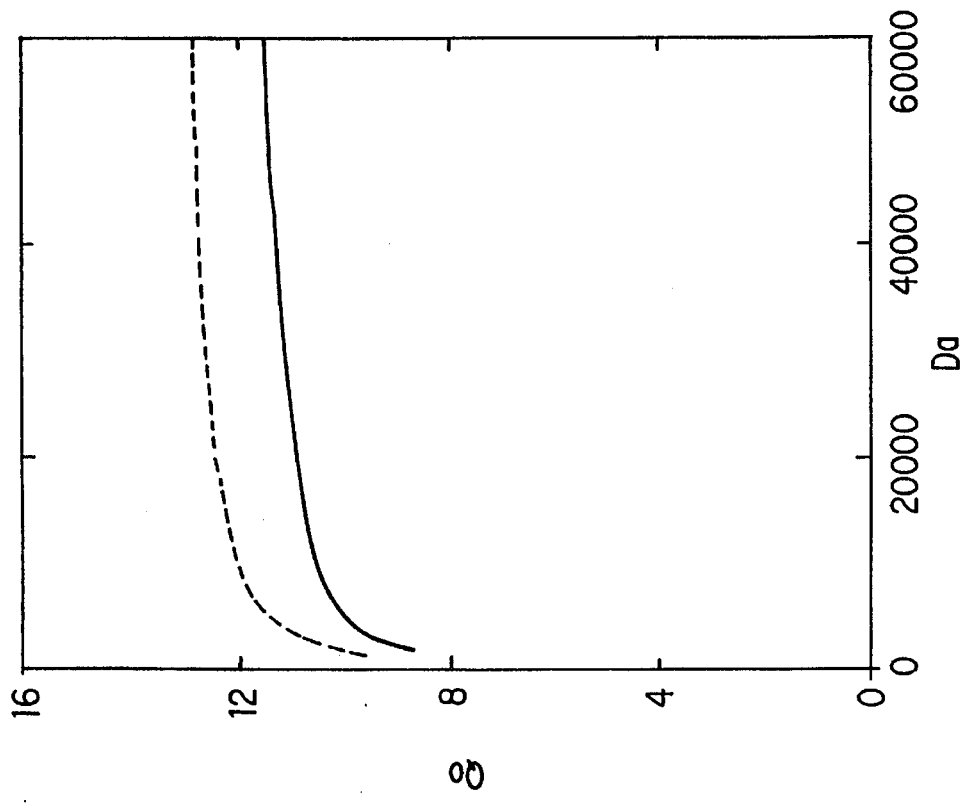
FIGS. 13–19 are graphical representations of computed steady state values for total amounts of various combustion and chemical quantities, integrated across a layer, which are shown as functions of the strain rate to which the layer is exposed.
Figure 13:
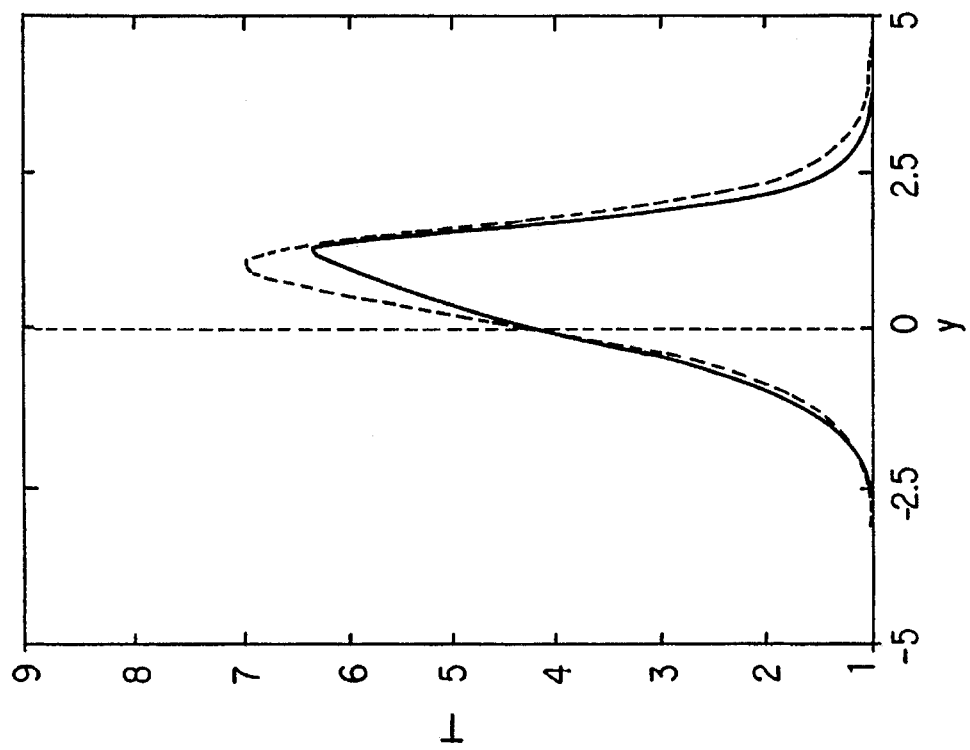
Figure 16:
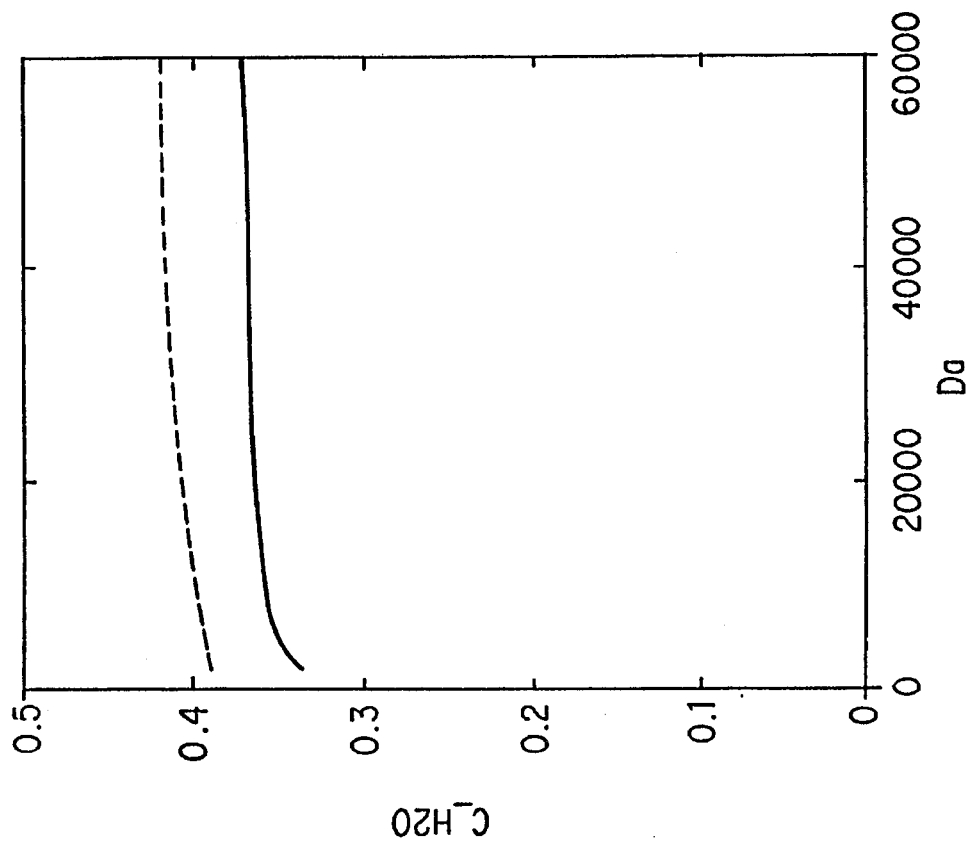
Figure 15:
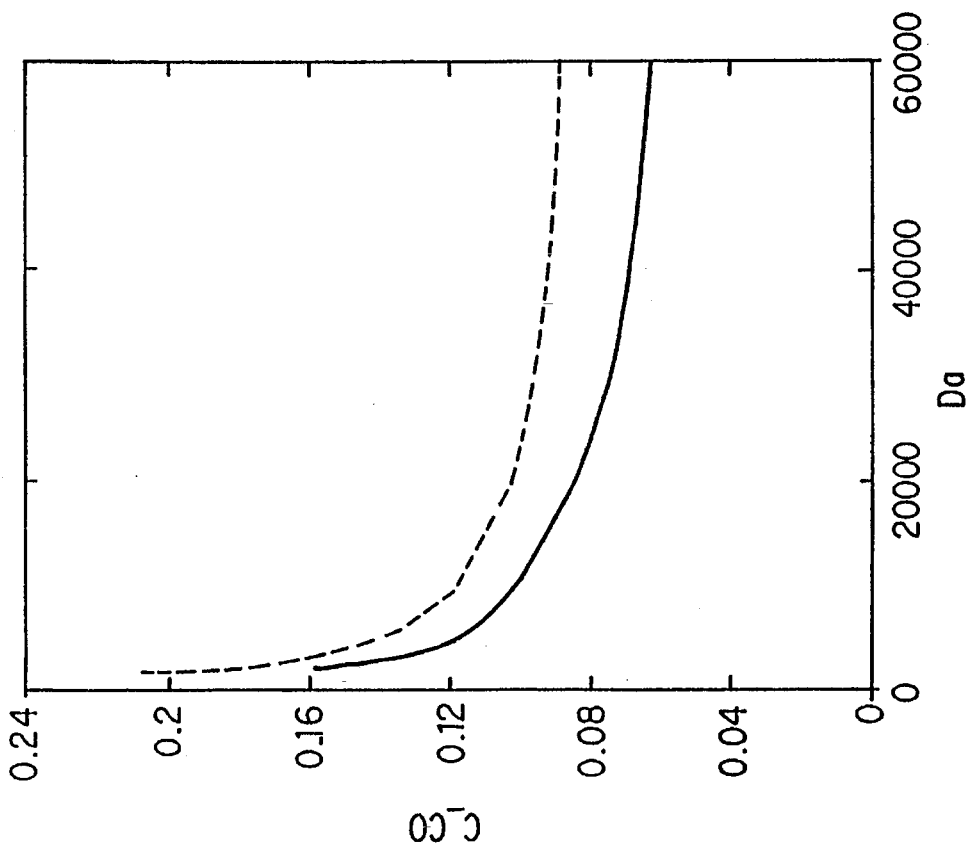
Figure 18:
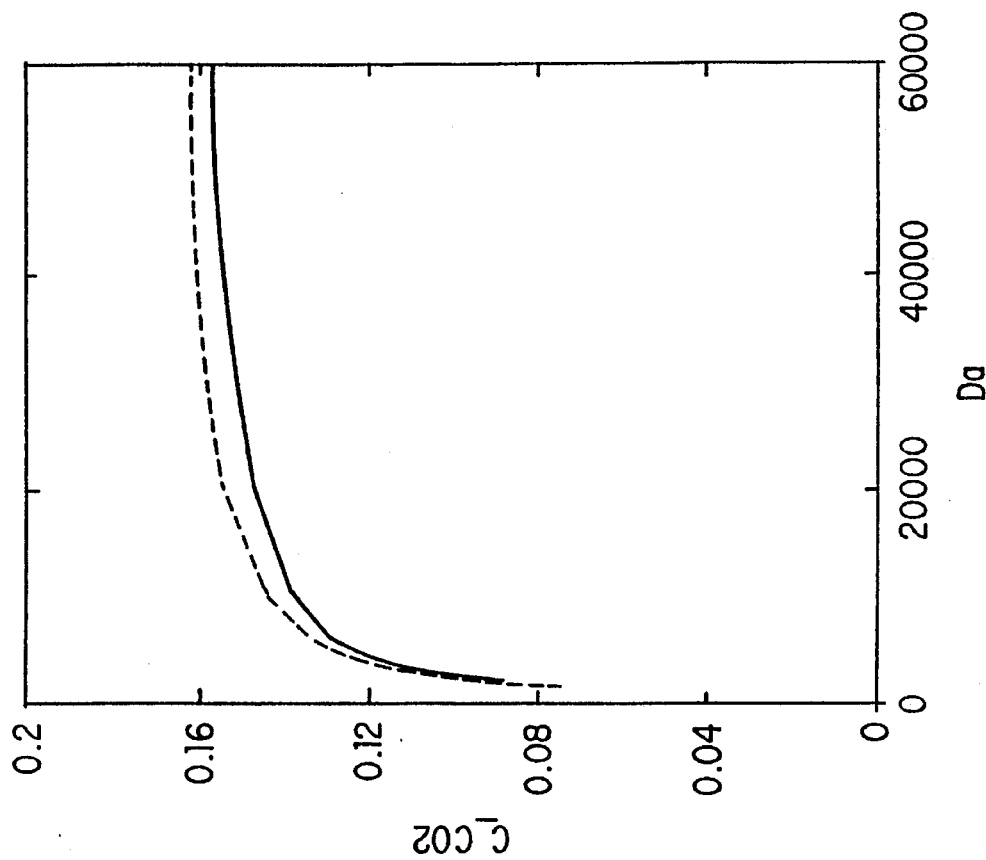
Figure 17:
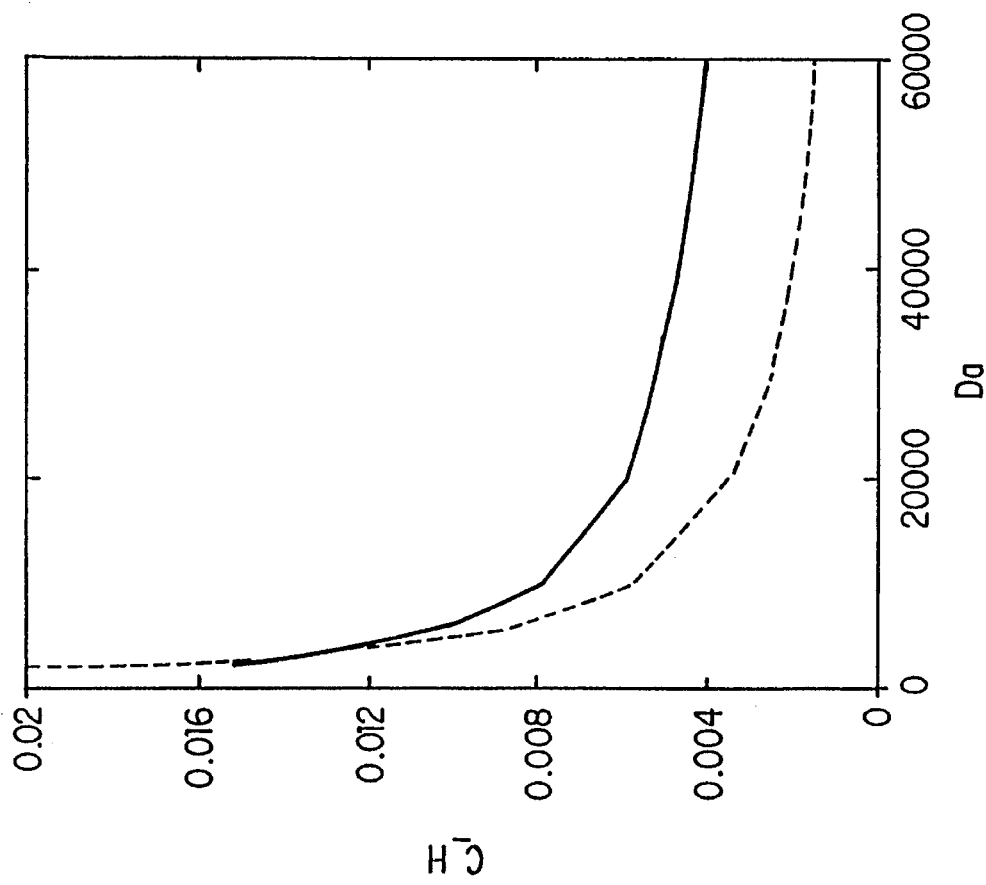

The Local Integral Method (LIM) model of this invention comprises suitable means for treating complex reaction chemistry in the nonequilibrium regime. With such method, it is now possible to address issues which are of particular interest to the gas combustion industry.

The LIM model of this invention allows relatively complex combustion chemistry can be addressed by using a detailed flamelet library which may comprise hundreds of elementary chemical reactions and a multiplicity of individual combustion radicals. Depending upon issues associated with gas combustion, particularly those that rely principally on the chemistry of trace species, it may be necessary to consider detailed descriptions of the elementary reaction kinetics, such as the formation of such combustion products as prompt $NO_x$. According to the method of this invention, computations associated with the flamelet approach are significantly simplified since the LIM model according to this invention requires tracking only the mixing of one or more conserved scalars, with the combustion reactions coupled to such fields via the flamelet library.

According to another preferred embodiment of this invention, complex chemistry is incorporated directly into the LIM model and involves direct unsteady calculation of elementary combustion reactions via the LIM formulation. According to such preferred embodiment, no additional flamelet approximation is required. Also, since each species is tracked separately with such preferred embodiment, differential diffusivities can be readily incorporated. However, since all the combustion reactions must be tracked simultaneously with the mixing process throughout the calculation, the complexity of the reaction sets that can be handled should be significantly reduced. Direct calculation of reduced kinetic sets in the LIM model of this invention offers the gas industry a very useful tool for directly calculating combustion processes in complex geometries under conditions not attainable with other conventional model approaches.

Four-Step Primary Methane-Air Reaction Kinetics

In order to accurately predict such phenomena as local extinction and reignition, as well as for predicting minor species emissions such as $NO_x$, a 4-step reduced mechanism for methane-air flames, taught by Peters, N. and Kee, R. J., "The Computation of Stretched Laminar Methane-air Diffusion Flames Using a Reduced Four-step Mechanism" SAND86-8842, Sandia National Laboratories, Livermore, Calif., 94550, 1986, has been implemented in which the evolution of seven individual chemical species are tracked. This mechanism consists of the following four reduced elementary reactions:

$$CH_4 + 2H + H_2O \rightarrow CO + 4H_2 \qquad \text{Eqn. 15}$$

$$CO + H_2O \rightarrow CO_2 + H_2 \qquad \text{Eqn. 16}$$

$$2H + M \rightarrow M + H_2 \qquad \text{Eqn. 17}$$

$$3H_2 + O_2 \rightarrow 2H + 2H_2O \qquad \text{Eqn. 18}$$

in which the corresponding reaction rates are given by $$w_1 = \left( k_1 + \frac{k_2 C_{H_2O}}{K_{C_{12}} C_{H_2}} \right) C_{CH_4} C_H \qquad \text{Eqn. 19}$$

$$w_2 = \frac{k_9}{K_{c_{12}}} C_H \left( \frac{C_{CO} C_{H_2O}}{C_{H_2}} - \frac{C_{CO_2}}{K_{II}} \right) \qquad \text{Eqn. 20}$$

$$w_3 = 2.34 \times 10^7 \, T p \, C_H \, C_{O_2} \qquad \text{Eqn. 21}$$

$$w_4 = k_{10} C_H \left( C_{O_2} - \frac{C_H^2 C_{H_2O}^2}{C_{H_2}^3 K_{IV}} \right) \qquad \text{Eqn. 22}$$

and where $$k_1 = 2.2 \times 10^4 T^{3.0} e^{-8760/RT} \qquad \text{Eqn. 23}$$

$$k_2 = 1.6 \times 10^6 T^{2.1} e^{-2450/RT} \qquad \text{Eqn. 24}$$

$$k_9 = 4.4 \times 10^6 T^{1.5} e^{-740/RT} \qquad \text{Eqn. 25}$$

$$k_{10} = 1.2 \times 10^{17} T^{-0.91} e^{-16520/RT} \qquad \text{Eqn. 26}$$

$$K_{C12} = 0.2657 T^{-0.0247} e^{15130/RT} \qquad \text{Eqn. 27}$$

$$K_{II} = 3.828 \times 10^{-5} T^{0.8139} e^{9839/RT} \qquad \text{Eqn. 28}$$

$$K_{IV} = 11.687 T^{-0.2467} e^{11396/RT} \qquad \text{Eqn. 29}$$

Denoting i as the reaction index and j as the species index, the corresponding matrix of stoichiometric coefficients is given by $$v_{ij} = \begin{pmatrix} -2 & 0 & -2 & +2 \\ -1 & -1 & 0 & +2 \\ +1 & -1 & 0 & 0 \\ +4 & +1 & +1 & -3 \\ 0 & +1 & 0 & 0 \\ -1 & 0 & 0 & 0 \\ 0 & 0 & 0 & -1 \end{pmatrix} \qquad \text{Eqn. 30}$$

The LIM model according to this invention implements a family of asymmetric profiles in the model, which are motivated by the inherent asymmetry in the internal profiles for nonunity stoichiometries. In this case, four degrees of freedom are employed: $\Delta$ is the displacement of the profile from the origin, $A_0$ is the maximum height of the profile, and $\delta_L$ and $\delta_R$ are parameters that determine the width of the profile to the left and right of the maximum height. The family of shape functions for the intermediate species, the reactant gradients, and the temperature can be chosen as $$c_m(y) = A_0 \frac{\delta_m^5}{((y-\Delta)^2 + \delta_m^2)^{5/2}} \quad m = L, R \qquad \text{Eqn. 31}$$

The subscript m denotes whether y is greater or less than $\Delta$, and $$\delta_m = \begin{cases} \delta_L, & \text{if } y \leq \Delta; \\ \delta_R, & \text{if } y \geq \Delta. \end{cases} \qquad \text{Eqn. 32}$$

The four profile parameters are related to the first four integral moments (e.g., $Q_0 \ldots Q_3$) of the profile as $$Q_0 = A_0 \frac{2}{3} (\delta_R + \delta_L) \qquad \text{Eqn. 33}$$

$$\frac{Q_1}{Q_0} = \frac{1}{2} (\delta_R - \delta_L) + \Delta \qquad \text{Eqn. 34}$$

$$\frac{Q_2}{Q_0} = \left[ \frac{1}{2} (\delta_R^2 - \delta_R \delta_L + \delta_L^2) + \Delta(\delta_R - \delta_L) + \Delta^2 \right] \qquad \text{Eqn. 35}$$

$$\frac{Q_3}{Q_0} = \left[ (\delta_R - \delta_L)(\delta_R^2 + \delta_L^2) + \frac{3}{2} \Delta (\delta_R^2 - \delta_R \delta_L + \delta_L^2) + \frac{3}{2} \Delta^2 (\delta_R - \delta_L) + \Delta^3 \right] \qquad \text{Eqn. 36}$$

with analogous expressions for the other profiles. Once these integral moments have been solved from the LIM equations, the four profile parameters for each profile can be recovered from the corresponding profile moments as follows. We eliminate the $\delta$'s from the last three equations above to obtain a cubic equation for $\Delta$, namely $$\Delta^3 - \left( 3 \frac{Q_1}{Q_0} \right) \Delta^2 + \left( 8 \frac{Q_1^2}{Q_0^2} - 5 \frac{Q_2}{Q_0} \right) \Delta + \qquad \text{Eqn. 37}$$

$$\left( -\frac{Q_3}{Q_0} + 8 \frac{Q_1}{Q_0} \frac{Q_2}{Q_0} - \frac{Q_1^3}{Q_0^3} \right) = 0$$

This equation is solved by a Newton iteration. Solving for the remaining quantities is then straightforward, namely $$\delta_R = \sqrt{2 \left( \frac{Q_2}{Q_2} - \frac{Q_1}{Q_0} \right) - \frac{1}{2} \left( \frac{Q_1}{Q_0} - \Delta \right)^2} + \qquad \text{Eqn. 38}$$

$$\left( \frac{Q_1}{Q_0} - \Delta \right)$$

$$\delta_L = \sqrt{2 \left( \frac{Q_2}{Q_2} - \frac{Q_1}{Q_0} \right) - \frac{1}{2} \left( \frac{Q_1}{Q_0} - \Delta \right)^2} - \qquad \text{Eqn. 39}$$

$$\left( \frac{Q_1}{Q_0} - \Delta \right)$$

$$A = \frac{(3/2) Q_0}{\delta_R + \delta_L} \qquad \text{Eqn. 40}$$

FIGS. 1–13 show typical model results from asymmetric profiles where individual species and temperature profiles across an isolated layer from the LIM model according to this invention are compared with exact results obtained via a finite difference computation. FIGS. 1–4 show the initial conditions used for LIM model calculations according to this invention, as well as for the finite difference calculations used to assess the model results. FIGS. 5–13 show results from the LIM model for internal profiles of $CH_4$, $O_2$, $N_2$, $CO_2$, $H_2O$, T, CO, $H_2$ and H, obtained for an isolated methane-air diffusion and reaction layer. In FIGS. 5–13, exact results from the finite difference calculations are shown for comparison purposes. Results shown in FIGS. 5–13 demonstrate that the LIM model according to this invention, with the asymmetric family of model profiles, accurately captures the progress of the molecular mixing and chemical reaction processes occurring in such layers, even for a relatively large number of species coupled together through their highly nonlinear reaction integrals.

Results shown in FIGS. 13–19 relate to computed steady state values for total amounts of various combustion and chemical quantities, integrated across the layer, which are shown as functions of the strain rate to which the layer is exposed. The Damköhler number (Da) quantifies the inverse strain rate, so that at relatively large Da, the layer is only weakly strained, and as Da decreases the strain rate increases, or in other words the chemical kinetic rates decrease until the combustion eventually strains out entirely.

Figure 20:
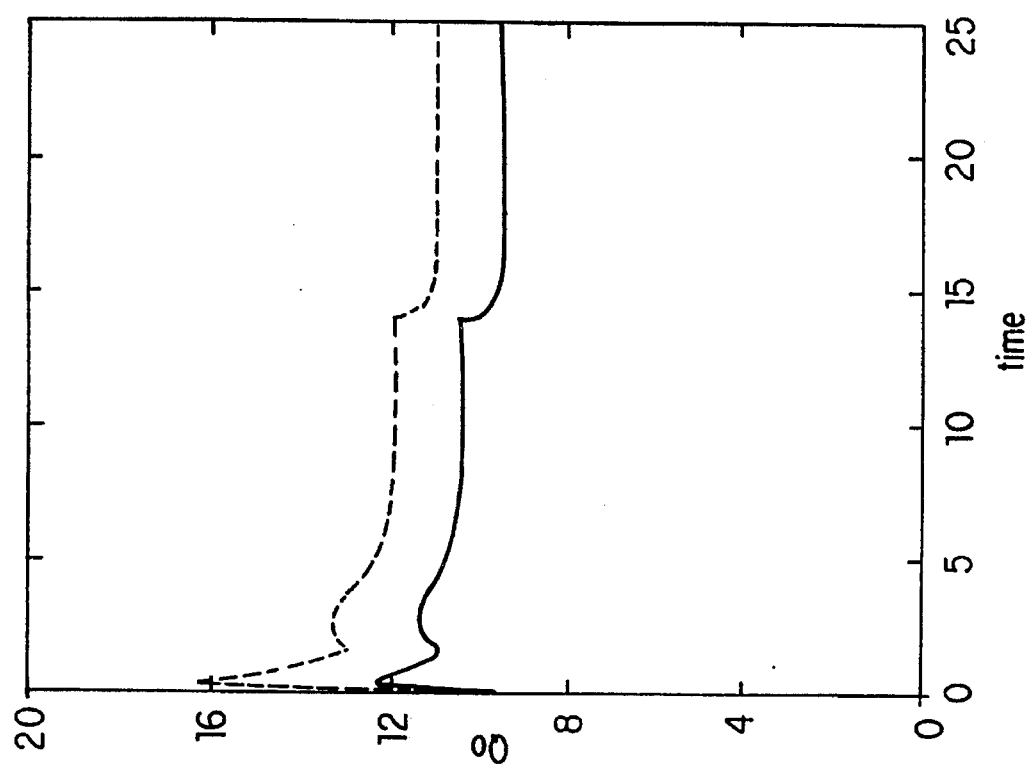
FIGS. 20 and 21 show graphical representations in which the strain rate is abruptly changed, and the results graphed are for an integrated temperature.
Figure 19:
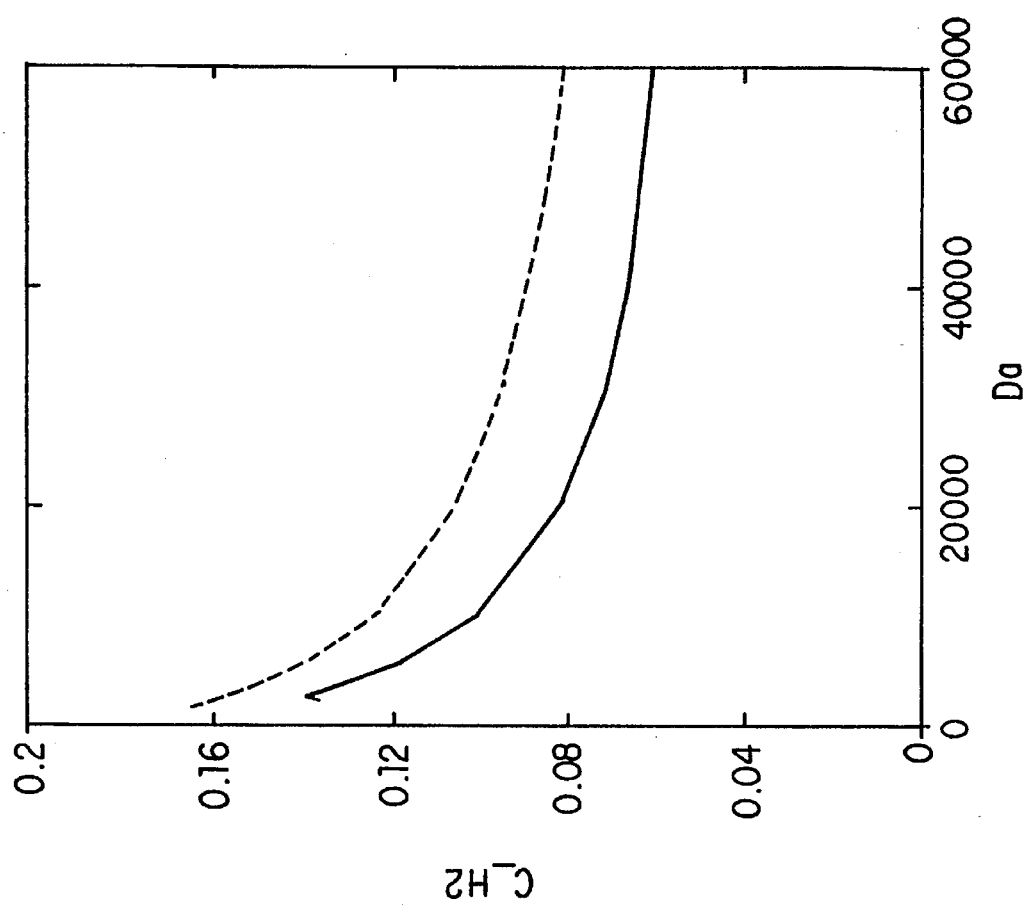
Figure 21:
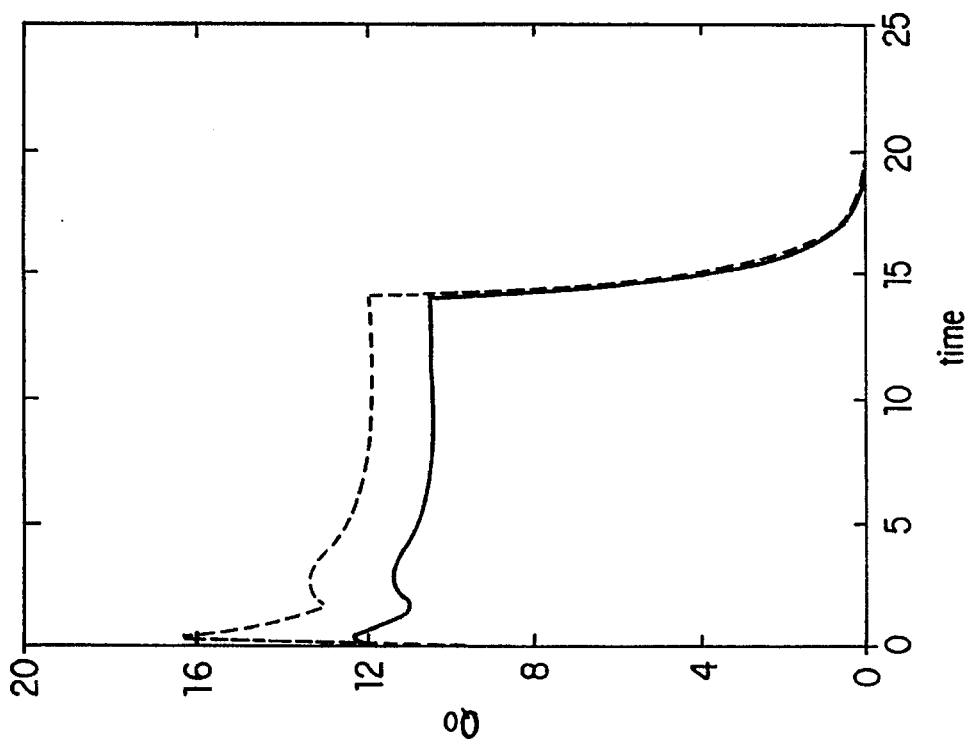

The dynamics of the LIM model, according to this invention, have been examined under the 4-step kinetic scheme, in response to time-varying strain rates, and the results have been compared against finite difference calculations. It is important for any unsteady Lagrangian model to be able to correctly capture the potentially complex dynamics inherent in the coupled nonlinear system formed by such a reaction kinetics set. FIGS. 20 and 21 show two cases in which the strain rate is abruptly changed, and in which the layers show very different responses. As shown in FIG. 20, the strain rate is held constant at Da=8,000 until the layer reaches steady state from its initial conditions. Time is non-dimensionalized by the inverse strain rate. Results shown in FIGS. 20 and 21 are for an integrated temperature. At t=14, the strain rate is suddenly increased to a value 27 times larger than before, so that Da=300. In both the LIM model according to this invention and the full simulation, the layer responds by reaching a new steady state at a slightly lower temperature. It should be noted that the LIM model according to this invention shows essentially the same dynamical behavior as the full simulation. As shown in FIG. 21, the strain rate is increased 270 times at t=14, and both the LIM model according to this invention and the full simulation show that the layer strains out. Time response of the LIM model according to this invention is essentially identical to that of the full simulation.

As can be seen from FIGS. 1–21, multi-step complex combustion kinetics can be practically incorporated into the LIM model according to this invention, to produce relatively accurate simulations of combustion chemistry. The LIM model of this invention potentially allows computations of flames at a level of detailed combustion kinetics that has not previously been possible.

Direct Thermal NO Calculations

Some conventional commercial codes do not permit detailed simulation but rather grossly approximate the physics of mixing in a flame. Such conventional codes offer detailed chemistry calculation but generally produce unreliable results. The LIM model according to this invention offers detailed chemistry calculations with very reliable results, and also allows $NO_x$ calculations to be coupled with such multi-step combustion chemistry in comparatively complex flows of interest for practical flames. Direct calculation of other $NO_x$ reaction paths, such as prompt NO, as well as other oxides of nitrogen, can also be practically computed with the LIM model according to this invention. Also, indirect calculations of both thermal and prompt NO are possible with the LIM model of this invention, using a flamelet approach which is described below in further detail.

The LIM method of this invention can be used for direct calculation of thermal NO. Principal reactions governing formation of thermal NO from molecular nitrogen during the combustion of fuel-air mixtures are given by the classical Zel'dovich mechanism. Such mechanism can be further reduced to a single-step by assuming steady-state N-atom concentration and various equilibrium assumptions. The NO reaction kinetics implemented in this embodiment of the LIM model of this invention are given by:

$$O + N_2 \rightarrow NO + N \qquad \text{Eqn. 41}$$

with the reaction rate given by:

$$\dot{w}_{NO} = 2.74(10^{17}) \frac{1}{T^{1/2}} \exp[-230.30/T] C_{O_2}^{1/2} C_{N_2} \qquad \text{Eqn. 42}$$

$$\dot{w}_{N_2} = 0 \qquad \text{Eqn. 43}$$

The temperature T and $O_2$ concentration fields from the primary methane-air reactions couple into the above NO reaction. The effect of the NO reaction rate on the temperature and $O_2$ concentration fields is negligible due to the relatively low NO concentration. In the LIM model of this invention, the local NO profiles are treated with the same asymmetric algebraic profiles used in primary combustion reactions.

NO formation kinetics are highly temperature sensitive and are also sensitive to various other species in the full kinetic set. It is known that quantitative predictions of trace combustion products such as $NO_x$ by anything less than a full chemical kinetic representation leads to very significant errors in the prediction of absolute levels of $NO_x$. For example, the differences between C1 and C2 chemistry cause a relatively large difference in the total amount of NO predicted. Such differences are noticed in full numerical simulations of very simple flow fields. Consequently, any model that incorporates simplified chemical kinetics is prone to such errors, irrespective of how the model is formulated in detail. Once a given kinetic set is adopted in a model, there is an inherent limitation in the accuracy of any NO predictions made by such model, and such limitation is not related to the model itself. Thus, a practical flame model can only yield accurate predictions of NO trends, and not absolute NO levels. From a practical perspective, such trends alone are often sufficient to achieve an improved burner or furnace design. A user of such a flame code typically asks whether a given design change will increase, decrease, or leave unchanged, prior levels of NO emissions. In practical uses of a flame model, it is often possible to reference the relative NO levels predicted by the model to a known condition, thereby allowing absolute emissions information to be obtained.

One object for a practical flame model is to provide a framework for incorporating whatever chemical kinetic scheme is adopted in a numerical model which itself does not introduce errors that are relatively large when compared with those errors inherent in the chemistry. The accuracy of the model can then be uniquely traceable to the inherent accuracy of the chosen chemical scheme. However, the model must also provide a proper balance between its emphasis on chemical kinetics and on the underlying fluid dynamics. A model which is based on a relatively detailed chemistry, but which is specific to a very narrow class of flames, is of little practical use. In one preferred embodiment according to this invention, the method incorporates a minimum kinetic scheme that is capable of giving accurate predictions for NO trends.

Figure 22:
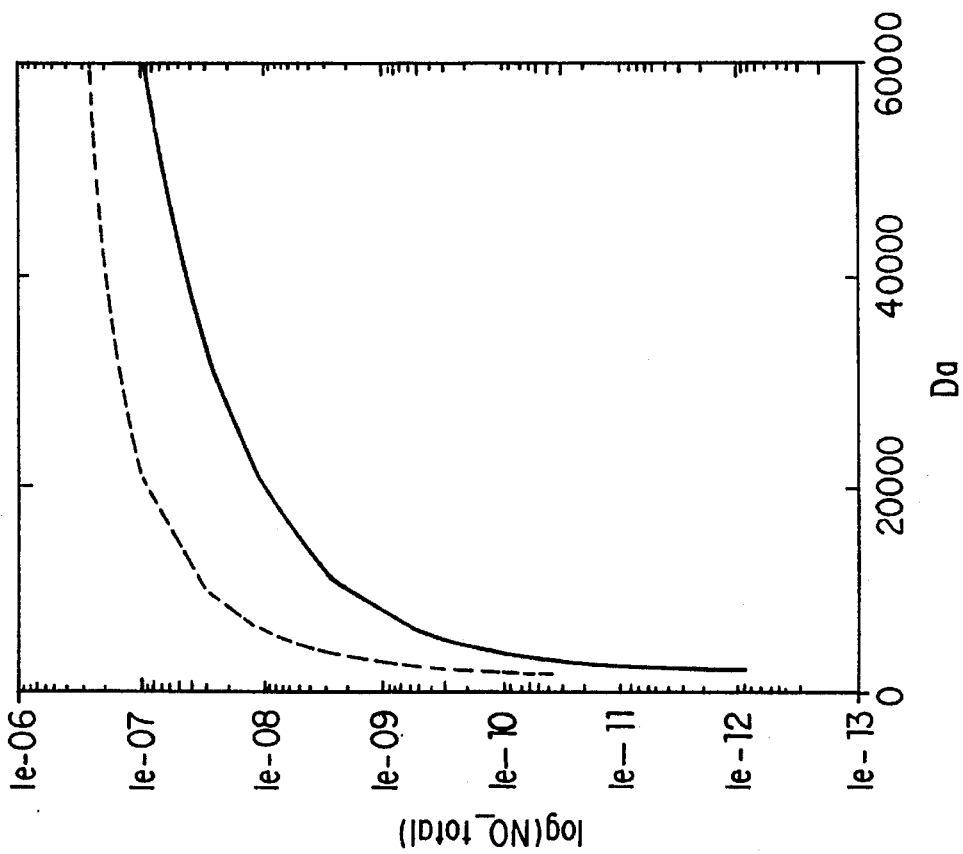
FIG. 22 is a graphical representation of LIM model results according to this invention, where the total NO is plotted against the Da number, and such graphical representation is compared with that of exact finite difference results.

FIG. 22 shows LIM model results according to this invention, where the total NO is plotted against the Da number and such plot is compared with exact finite difference results. The LIM model according to this invention yields NO predictions that are typically between a factor of 20 and a factor of 2 too high. The differences appear to be largely due to the over-prediction of the peak temperature by the LIM model, as shown in the temperature profile of FIG. 13. Thermal NO kinetics are highly sensitive to such peak temperature. The largest errors occur at relatively low Da numbers, or in other words at relatively high strain rates, near flame extinction. Near the highest end of the burning branch, absolute NO levels predicted by the LIM model of this invention are typically only about 2 to 4 times too high. Such errors in the total NO level are relatively small when compared with the errors inherent in predictions of absolute NO levels by any conventional and practical kinetic scheme. The LIM model of this invention accurately captures the trends in the NO levels with increasing Da numbers. Such trends are also consistent with experimental results that show decreasing peak NO concentration in strained laminar diffusion layers with increasing strain rate.

In another preferred embodiment according to the LIM model of this invention, a strained flamelet approach is used for nonequilibrium combustion chemistry in flames. Relatively highly complex combustion chemistry is addressed via a detailed flamelet library computed separately from a particular reacting flow problem. One important aspect of the flamelet approach is that the mixing and reaction chemistry are completely decoupled from each other. The LIM model of this invention then needs only to track the mixing of a conserved scalar, with the combustion reactions superimposed on such field via the flamelet library.

LIM Flamelet Formulation for Nonequilibrium Combustion

According to the LIM model of this invention, in one preferred embodiment, the evolution of the mixing in the flame is decoupled from the combustion processes occurring within it. Such method relies on the notion of an appropriately defined conserved scalar variable $\zeta(x,t)$ which defines the local elemental composition at each point in the flow. In the full chemical equilibrium limit, such elemental composition completely determines the resulting reactants, products and radical species concentrations via a set of equilibrium state relations. At conditions sufficiently far from chemical equilibrium, the equilibrium departures are characterized by the scalar energy dissipation rate field $D\nabla\zeta\cdot\nabla\zeta(x,t)$, giving the local rate of molecular mixing in the flow. The species concentrations $Y_i$ and reaction rates $w_i$ are then characterized by a library approach which is presumed universal. Construction of this library requires identification of a canonical mixing and reaction environment which adequately represents the local combustion environment throughout the flame. In turbulent flows, essentially all the mixing occurs in thin strained laminar diffusion layers. Accordingly, the environment chosen for constructing this universal flamelet library is an isolated, strained, laminar, diffusion and reaction layer. Once this library is constructed from a set of detailed numerical calculations of such an isolated, strained, laminar, diffusion and reaction layer, using a highly detailed reaction kinetics mechanism, including heat release effects, species-dependent and temperature-dependent thermochemical transport properties, differential diffusivity effects, and the like, selection of the local values of the species concentrations and reaction rates at any point in the flow only requires knowledge of the local conserved scalar and scalar energy dissipation rate values. As a consequence, the LIM model is then used to determine the instantaneous structure of the scalar field $\zeta(x, t)$ for the particular flow problem at hand. Only the mixing process needs to be recomputed using the LIM equations for the conserved scalar field, as discussed below, in order to address different geometries or flow conditions.

The complete local integral equations that form the basis of LIM modeling according to this invention have been derived for the general case of an advective-diffusive-reactive species. Flamelet formulation of non-equilibrium combustion deals with the evolution of a simpler advective-diffusive quantity $\zeta(x,t)$, which undergoes no reaction itself. As a consequence, the governing LIM equations of this invention can be directly derived from the complete equations by simply setting the reaction integrals to zero.

For the conserved scalar field, it is only necessary to track the evolution of moments of the scalar gradient field, where the integral moments are defined as $$G_j \equiv \int_{-\infty}^{+\infty} n^j \frac{\partial \zeta}{\partial n} \, dn, \, j = 0, 1, 2 \ldots \qquad \text{Eqn. 44}$$

These moments must follow the governing LIM equations given by $$\frac{dG_0}{dt} = 0 \qquad \text{Eqn. 45}$$

$$\frac{dG_1}{dt} = -\sigma G_1 \qquad \text{Eqn. 46}$$

-continued $$\frac{dG_2}{dt} = -2\sigma G_2 + 2DG_0 \qquad \text{Eqn. 47}$$

This limit is relatively simple since the internal structure of the scalar dissipation layers is determined by just two moments. The only aspect of the combustion chemistry evolution remaining is the treatment of layer interactions.

The requirement for a smooth reconstruction of the conserved scalar field to allow its net gradient field to be evaluated dictates a smooth reconstruction process to obtain the conserved scalar field from the moments on the material interface. It is possible to track the scalar gradient field itself, and then reconstruct the scalar field from it. Since $\nabla\zeta(x,t)$ can be constructed directly from the LIM moment parameters on the tracked surface, the divergence of this field can be taken to produce the $\nabla\cdot\nabla\zeta(x,t)$. This is the definition of the Laplacian of the scalar field itself, namely $\nabla^2\zeta(x,t)$. Thus, the unknown scalar field $\zeta(x,t)$ can be determined from the solution of a simple Poisson equation, namely $$\nabla^2\zeta(x,t) = \nabla\cdot(\nabla\zeta(x,t)) \qquad \text{Eqn. 48}$$

which can be done efficiently using a fast, standard, Poisson solver package. This procedure produces the scalar and scalar dissipation rate field values at any desired point in the flow at the particular time of interest. The scalar field reconstruction only needs to be done for a few discrete times at which detailed flame structure information is desired. This also considerably speeds up the LIM flamelet model. Once the scalar and dissipation rate values are known, the next step involves selecting the corresponding entry in the flamelet library to assign the species concentrations and reaction rates at any desired point in the flame.

Figure 23:
FIG. 23 shows a tracked interface on which LIM moments are computed at a particular time in a planar jet flow field.
Figure 24A:
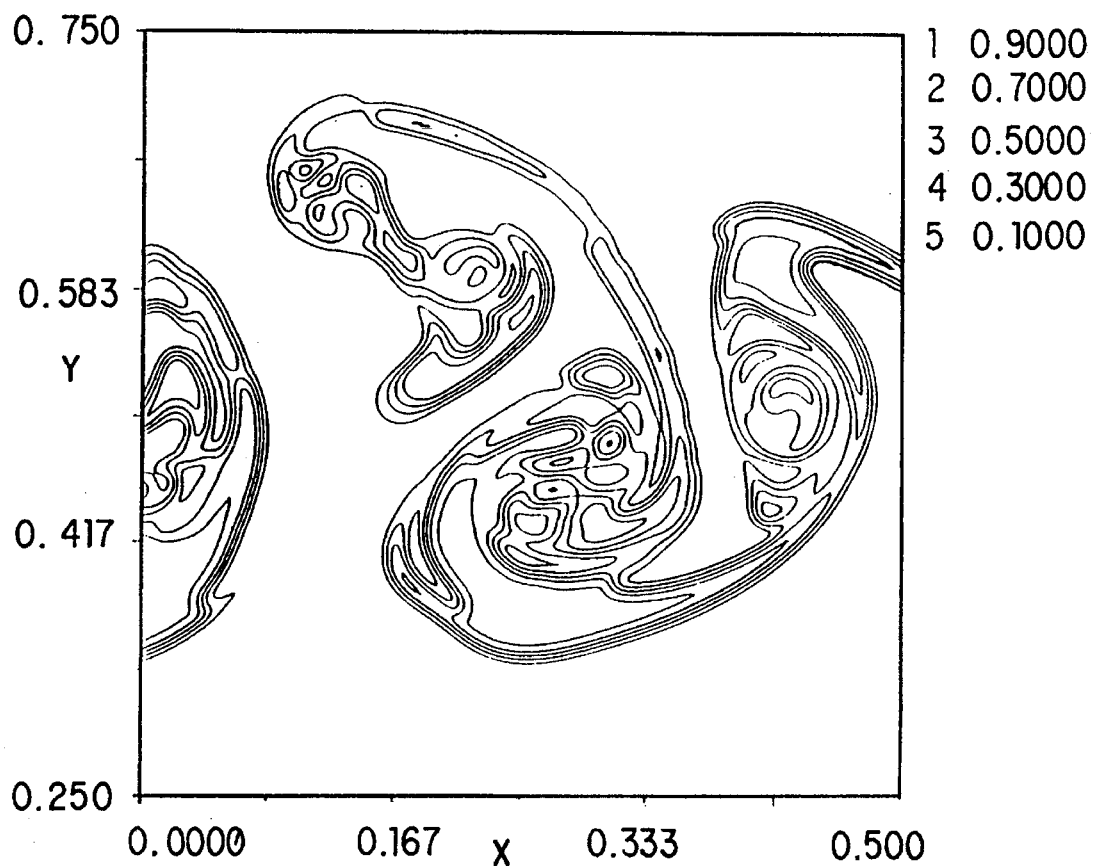
FIG. 24a shows the conserved scalar field in the left half of the field shown in FIG. 23, computed by an LIM model according to one preferred embodiment of this invention.
Figure 24B:
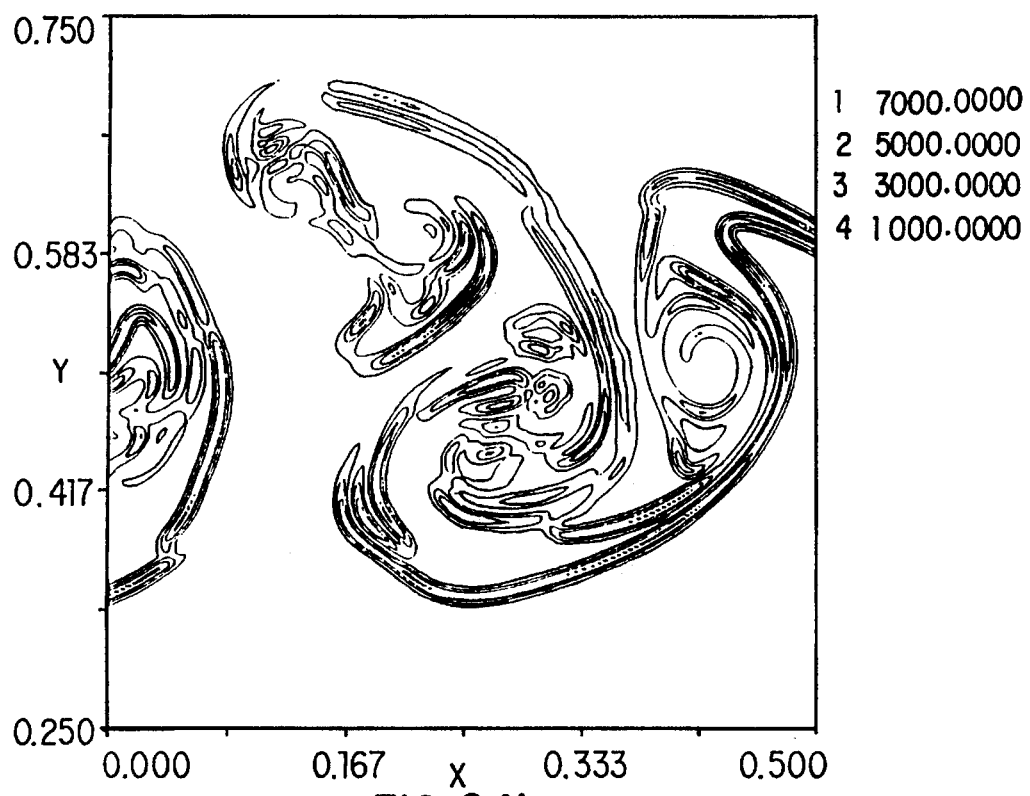
FIG. 24b shows the scalar energy dissipation rate field in the left half of the field shown in FIG. 23, also computed by an LIM model according to one preferred embodiment of this invention.
Figure 25A:
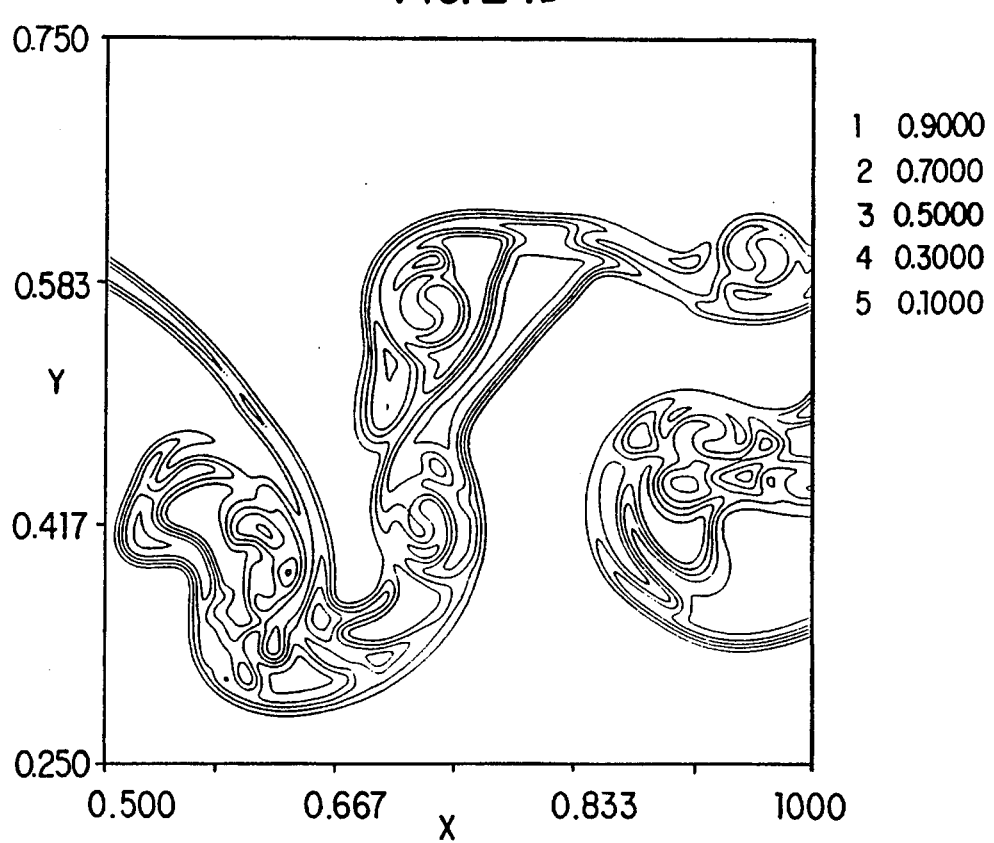
FIG. 25a shows the conserved scalar field in the right half of the field shown in FIG. 23, as computed by an LIM model according to one preferred embodiment of this invention.
Figure 25B:
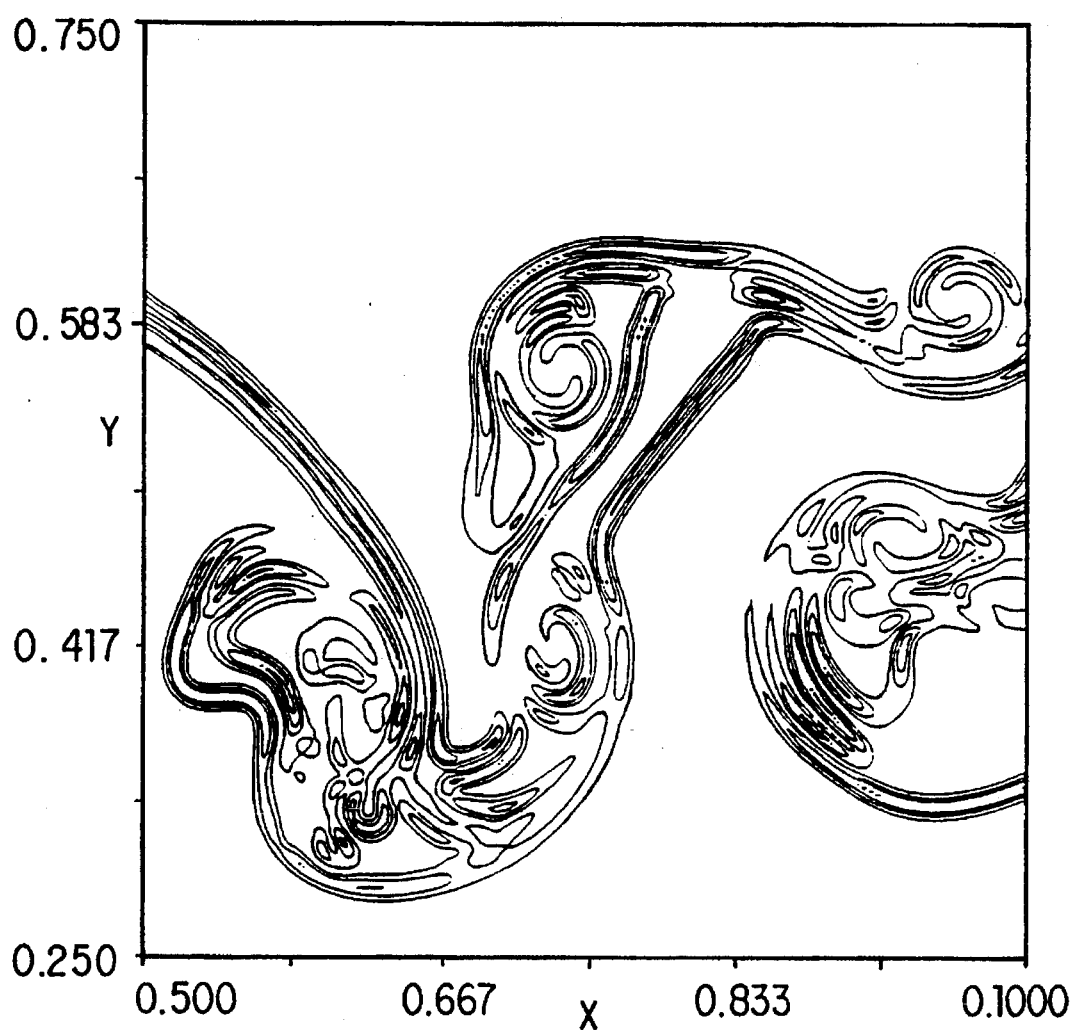
FIG. 25b shows the scalar energy dissipation rate field in the right half of the field shown in FIG. 23, also computed by an LIM model according to one preferred embodiment of this invention.

Sample results for the conserved scalar and scalar dissipation rate fields obtained using the LIM model according to this invention will now be discussed. FIG. 23 shows the tracked interface at a particular downstream (temporal) location in a planar jet flow field, on which the integral moments are evolved over time. For the particular time shown in FIG. 23, the corresponding scalar field $\zeta(x,t)$ in the left half of the field of view is shown in the form of a contour plot in FIG. 24a, and the corresponding scalar dissipation rate field $\nabla\zeta\cdot\nabla\zeta(x,t)$ is shown in FIG. 24b. These fields are relatively complex despite the fact that they show only a small portion of the overall scalar field tracked by the LIM model of this invention. The scalar and dissipation rate fields in the right half of the field of view in FIG. 23 are shown in FIGS. 25a and 25b, respectively. It is clear that the detailed structure of these fields, computed by the LIM model according to this invention, exceeds the level of information presentable in such contour maps. For this reason, FIG. 26 shows the same fields as in FIG. 25, but with color assignments giving the corresponding values. There are two points to note here. First, the overall structure of these fields, especially the scalar dissipation field in FIG. 26b, is remarkably similar in structure to direct imaging measurements of the scalar dissipation field structure in turbulent flows. Second, for the typical average temperature of 1800° K. and the corresponding hot flow Reynolds number of 2000 used in these calculations, the corresponding cold flow Reynolds number is roughly 30,000.

In constructing the instantaneous species concentration and reaction rate values, selection of the proper entry in the flamelet library requires mapping from the local ($\zeta, \nabla\zeta\cdot\nabla\zeta$) values obtained as discussed above to the physically correct strain rate $\epsilon$ characterizing the local strained laminar diffusion and reaction layer. The essential point to note here is that the pair of values ($\zeta, \nabla\zeta\cdot\nabla\zeta$) in, for example, FIGS. 26a and 26b determines the local strain rate value. While analytical solutions exist for this mapping for nonreacting strained diffusion layers, the numerical calculations of complex reacting layers from which the flamelet library is built up typically include calculations for the conserved scalar and scalar dissipation rate profiles across the layer. This in principle allows the mapping to be constructed directly from the underlying flamelet calculations.

Figure 27:
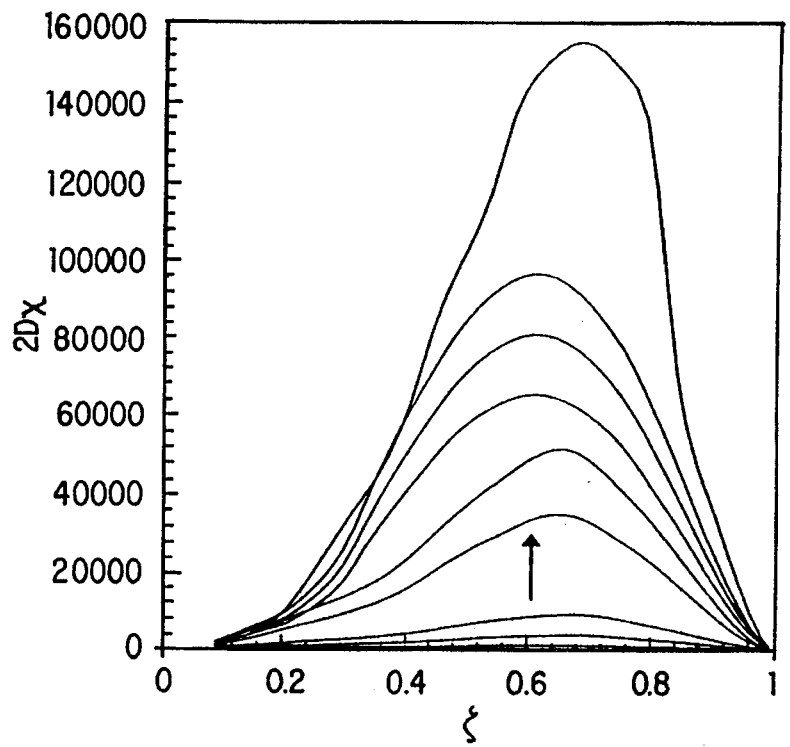
FIG. 27 shows a strain rate mapping obtained from the strained laminar diffusion and reaction layer calculations according to one preferred embodiment of the method of this invention.
Figure 28:
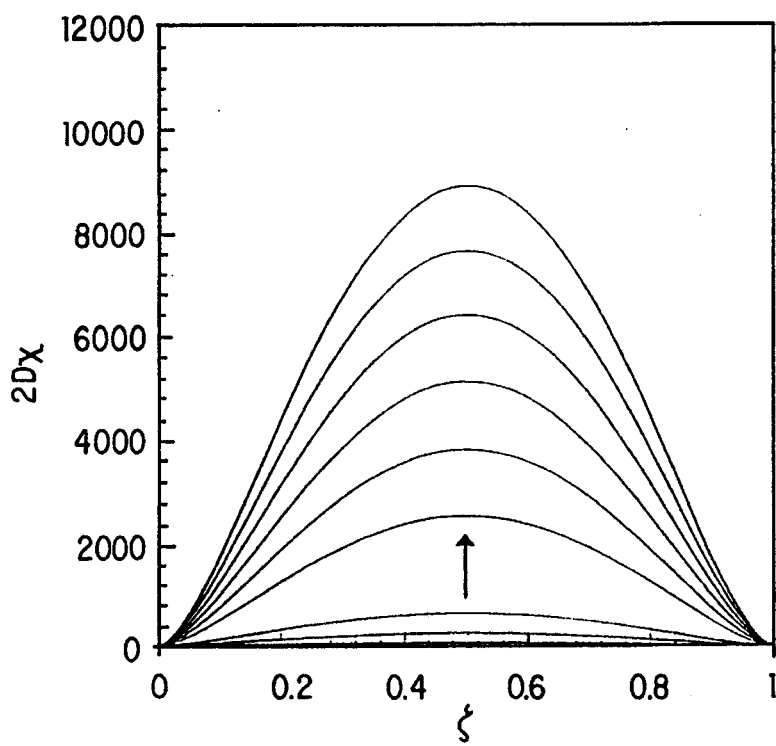
FIG. 28 shows analytical results for the strain rate mapping obtained from solution of the conserved scalar field in a nonreacting strained laminar diffusion layer.

A flamelet library for pure hydrogen-air strained laminar diffusion and reaction layers can be used, such as one generated from numerical calculations using a subset of a conventional Miller & Bowman hydrogen-air kinetic mechanism. Constructing the library requires mapping each $(\zeta, \nabla\zeta \cdot \nabla\zeta)$ pair to the corresponding strain rate $\epsilon$. The mapping obtained from the numerical calculations is shown in FIG. 27. Note that the strain rate corresponding to the extinction limit is $\epsilon=14,000$ s$^{-1}$. For values of $\zeta$ near 0 and 1, the detailed kinetics calculations can be seen to produce a slightly nonunique mapping, presumably due to a nonuniqueness in defining the conserved scalar that results from differential species diffusivities. For this reason, a fit to the mapping in FIG. 27 is used to eliminate this nonuniqueness. The fit is based on the analytical result for a nonreacting layer, given by $$\epsilon = \pi D \left[ \frac{\nabla\zeta \cdot \nabla\zeta}{(\zeta^+ - \zeta^-)^2} \right] \exp 2 \left\{ erf^{-1} \left[ \frac{\zeta - \frac{1}{2}(\zeta^+ + \zeta^-)}{\frac{1}{2}(\zeta^+ - \zeta^-)} \right] \right\}^2 \quad \text{Eqn. 49}$$

which is shown in FIG. 28. This analytical result, which contains much of the underlying physics and thus provides a good starting point for the fit, is then adjusted by multiplication with a polynomial to produce the analytical mapping shown in FIG. 29. This result sufficiently agrees with the numerical mapping in FIG. 27, but does not suffer from the nonuniqueness at relatively small and relatively large scalar values.

$\zeta^+$ and $\zeta^-$ represent the scalar endpoint values on either side of the layer. In the present library, these values correspond to pure fuel and air, as is used in conventional flamelet approaches. However, in general, few of the layers in the far field of a flame are bounded by pure fuel and air, but instead generally involve various degrees of partial premixing on one or both sides of the layer. A detailed treatment could take this into account but, as generally done in conventional flamelet models, the effect of varying endpoint values is ignored.

Figure 30A:
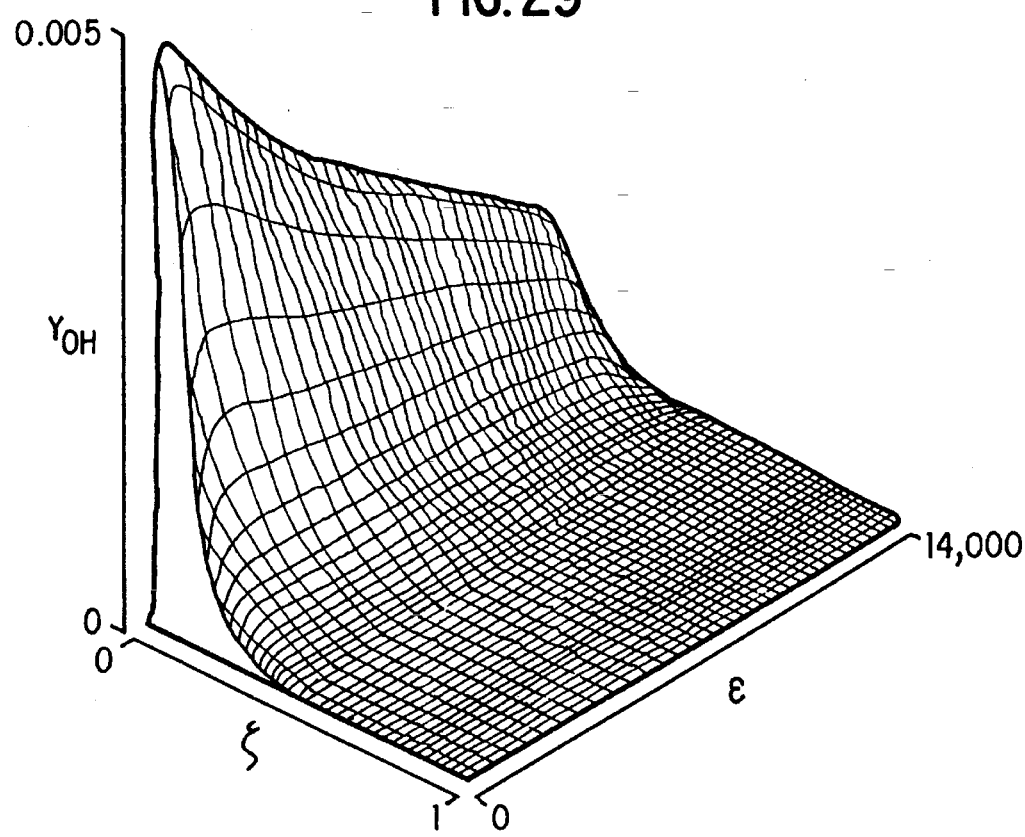
FIG. 30a shows a graphical library for the OH radical mass fraction.
Figure 30B:
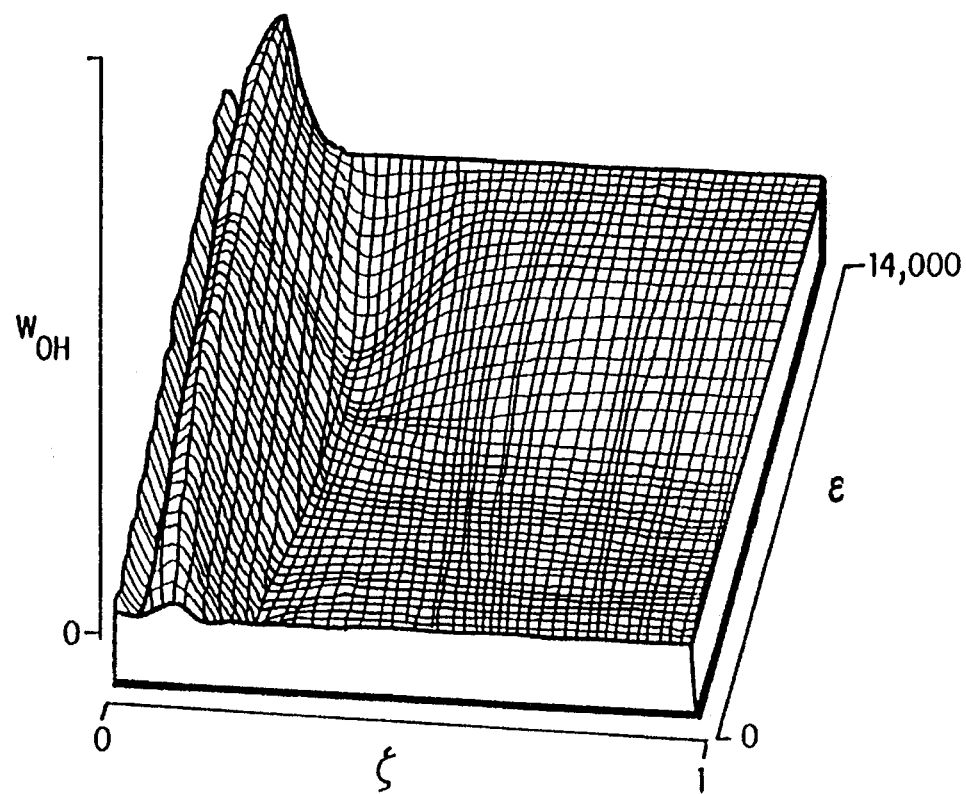
FIG. 30b shows a graphical library for the OH radical reaction rate (mol/cm$^3$-s)

The mapping, together with the mass fraction library $Y_i(\zeta,\epsilon)$ and the reaction rate library $w_i(\zeta,\epsilon)$, allows the LIM model according to this invention to assess the nonequilibrium flame structure. FIGS. 30a and 30b show these libraries for the OH radical. Similar maps can be defined for all the other species in the kinetics set used. For the hydrogen-air mechanism previously discussed, for strain rates above $\epsilon=14,000$ s$^{-1}$, the layer extinguishes and the OH reaction rate library in FIG. 30b appropriately contains zero values. The mass fraction library in FIG. 30a also contains zero-OH concentrations in the domain of $(\zeta,\epsilon)$, but such values are spurious since they correspond only to the steady state attained long after extinction. The OH concentration in the transient layer after extinction follows an exponential decrease due to the continued straining action of the flow field. A steady flamelet formulation cannot account for this transient, as well as other effects of unsteadiness, and therefore the zero-OH concentrations due to extinction in the $Y_{OH}(x,t)$ and $Y_{NO}(x,t)$ fields discussed in this specification only denote where extinction has occurred. However, the results obtained for the $w_{OH}(x,t)$ and $w_{NO}(x,t)$ fields represent instantaneous rate information, and thus do not suffer such shortcoming.

Figure 31:
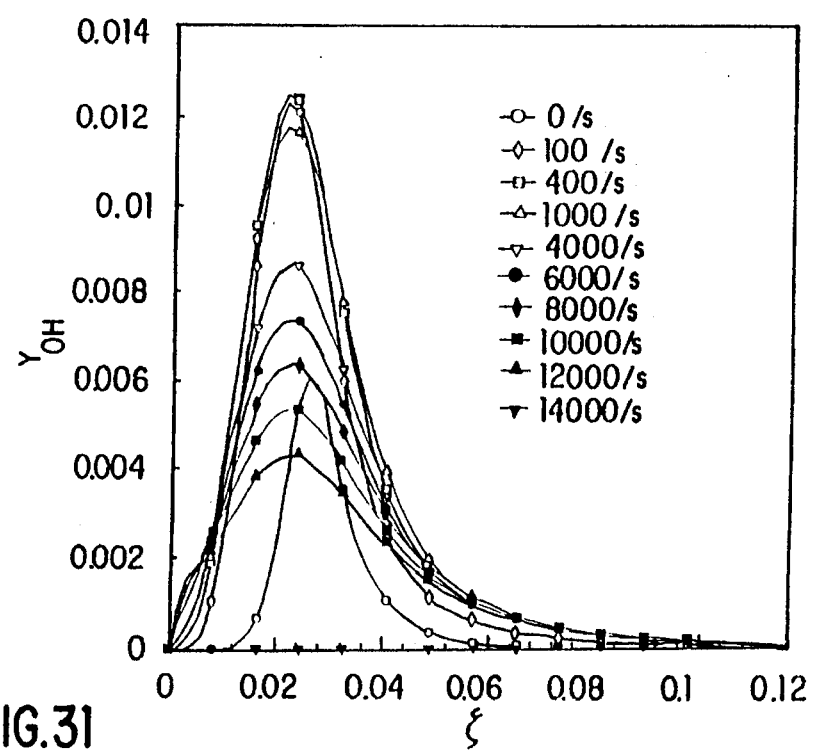
FIG. 31 shows a graphical library for the OH radical mass fraction in an isolated, strained, laminar, diffusion and reaction layer with various strain rates.
Figure 32:
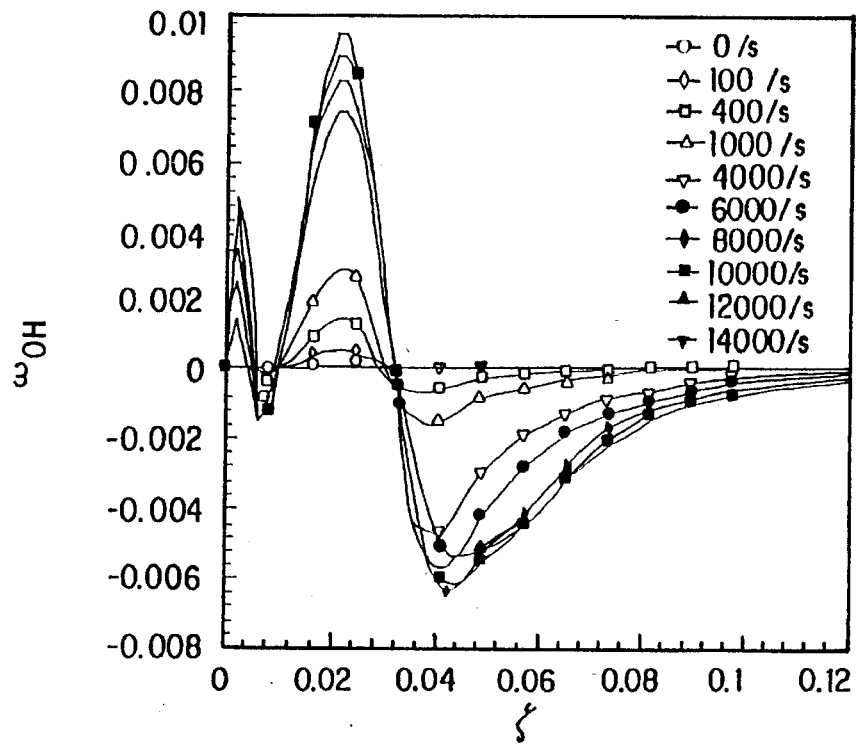
Figure 33A:
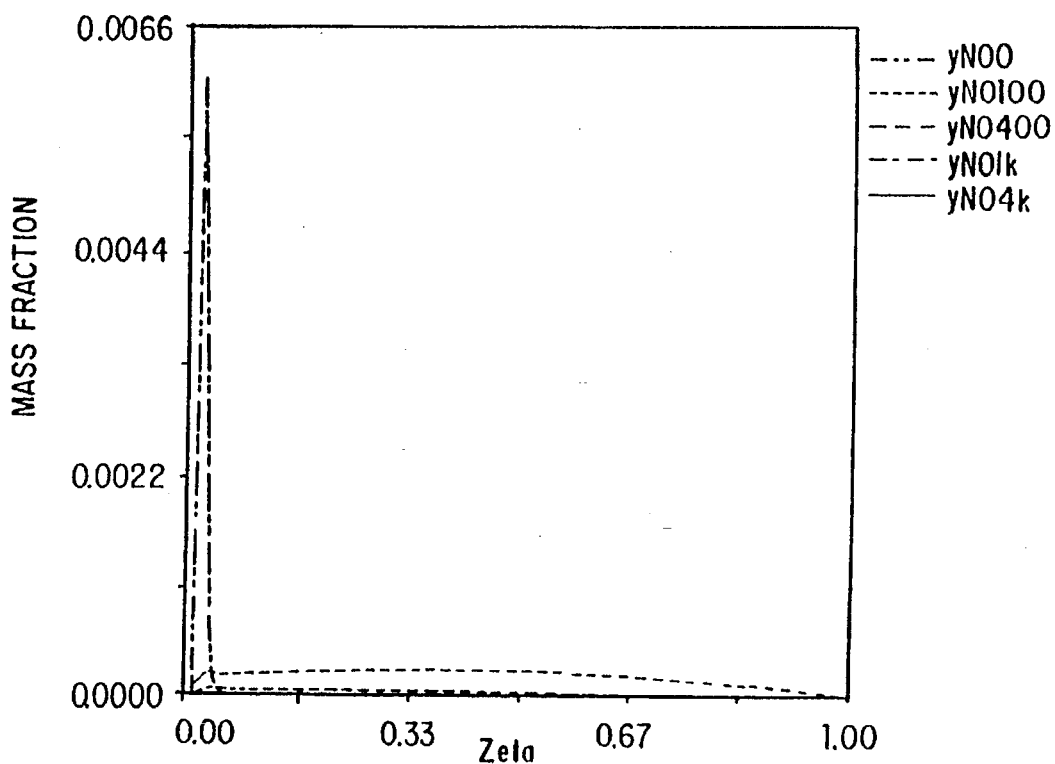
FIGS. 33a–34 show graphical representations of various nitric oxide mass fraction libraries.
Figure 33B:
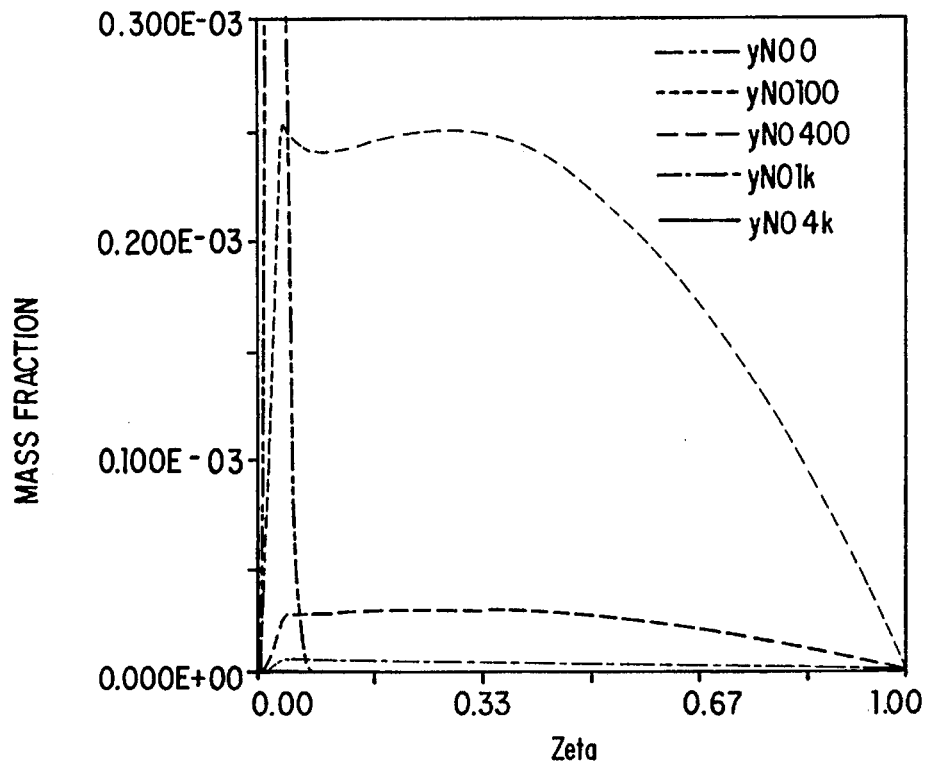
Figure 33C:
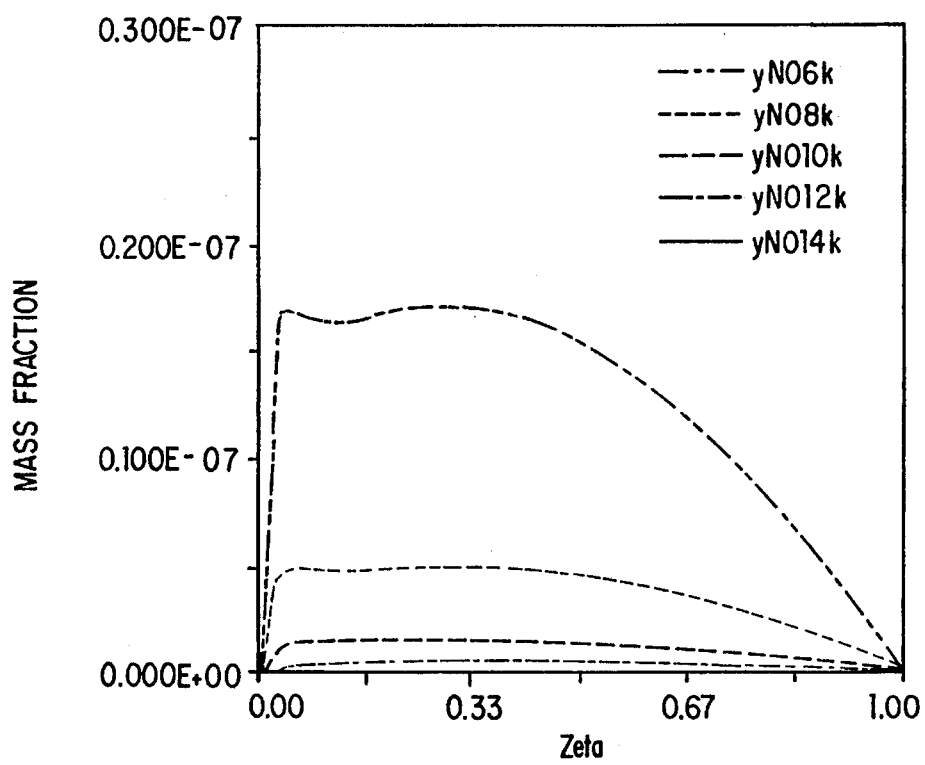
Figure 34:
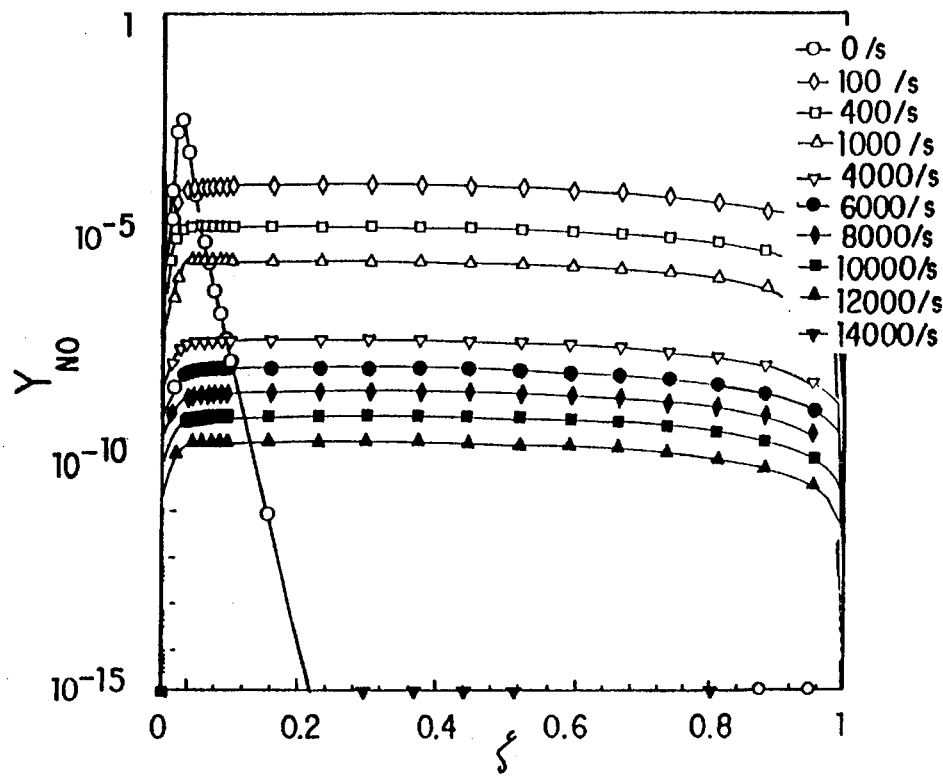

The effect of the local strain rate on the shape and magnitude of the species concentration and reaction rate libraries is shown for OH in FIGS. 31 and 32. In going from equilibrium to even very low strain rates, the width of the OH profile in conserved scalar space increases markedly. This effect plays a major role in the structure of the OH concentration and reaction rate fields. Similarly, the peak OH concentrations initially increase in going from equilibrium to a strain rate of 100 s$^{-1}$, but then drop off rapidly with increasing strain rates up to the extinction point. The reaction rate library is shown in the same manner in FIG. 32, where it is apparent that there is not such a dramatic effect of the strain rate on the profile width in conserved scalar space. Ultimately, this is why the mass fraction fields from flamelet calculations, as well as from direct imaging measurements, show a continuing layer-like structure in the reaction rate fields. The libraries for nitric oxide concentration and reaction rate are shown in the same fashion in FIGS. 33 through 35. As shown in FIGS. 33 and 34, even for very small values of the strain rate, the NO concentration drops off very quickly from the equilibrium level, and the width of the profile in conserved scalar space covers essentially the entire range of the scalar variable $\zeta$. While this may be expected for a chemical species as slow as NO, the effect is surprisingly dramatic and helps to explain some of the results obtained from the method according to this invention. FIG. 35 shows the NO reaction rate profiles in conserved scalar space for values of the strain rate ranging from equilibrium to extinction. While the peak NO reaction rate decreases continually with increasing strain rate, the width of the profile does not change very much.

Nonequilibrium Combustion in H$_2$-Air Flames

The following experimental results represent two different hydrogen-air turbulent jet diffusion flames, all having the same Reynolds number (Re) wherein the hot flow Reynolds number is Re$_\delta \approx 2,000$ giving the equivalent cold flow Reynolds number as Re$_\delta \approx 30,000$ which is comparable to many laboratory flames, but ranging from near chemical equilibrium to moderate nonequilibrium conditions. It is not difficult to analyze flames up to extinction conditions at this same Re number which simply amounts to choosing the effective exit conditions. Results discussed are for a slot orifice having a width of 1 mm.

Figure 26A:
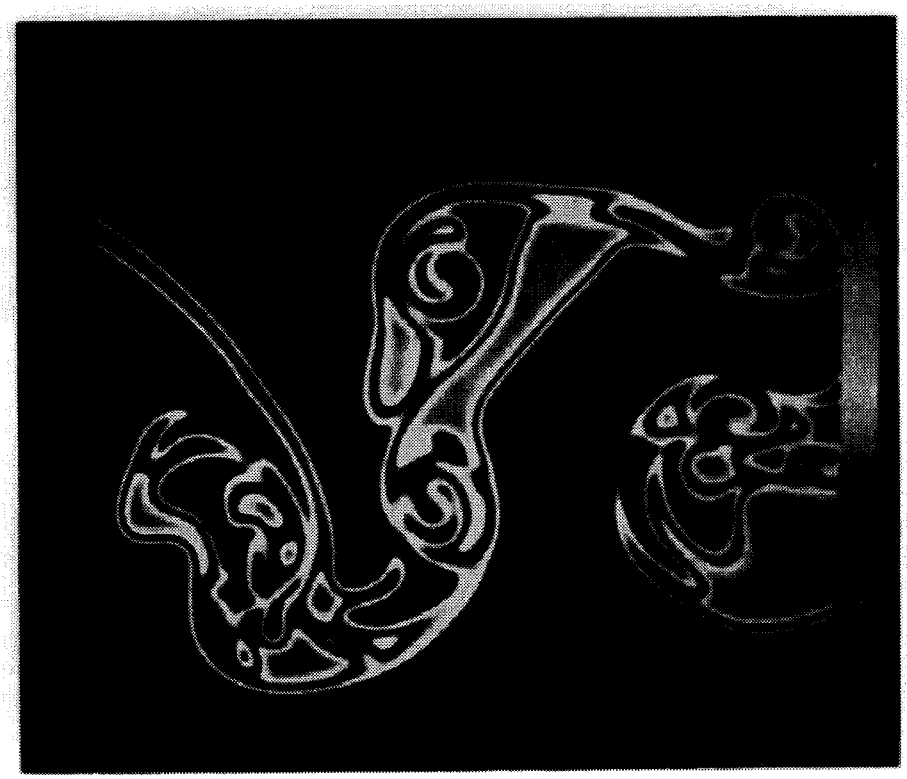
FIG. 26a shows a graphic visualization identifying the detailed LIM model results according to one preferred embodiment of this invention, for the scalar field in the right half of the field shown in FIG. 23.
Figure 26B:
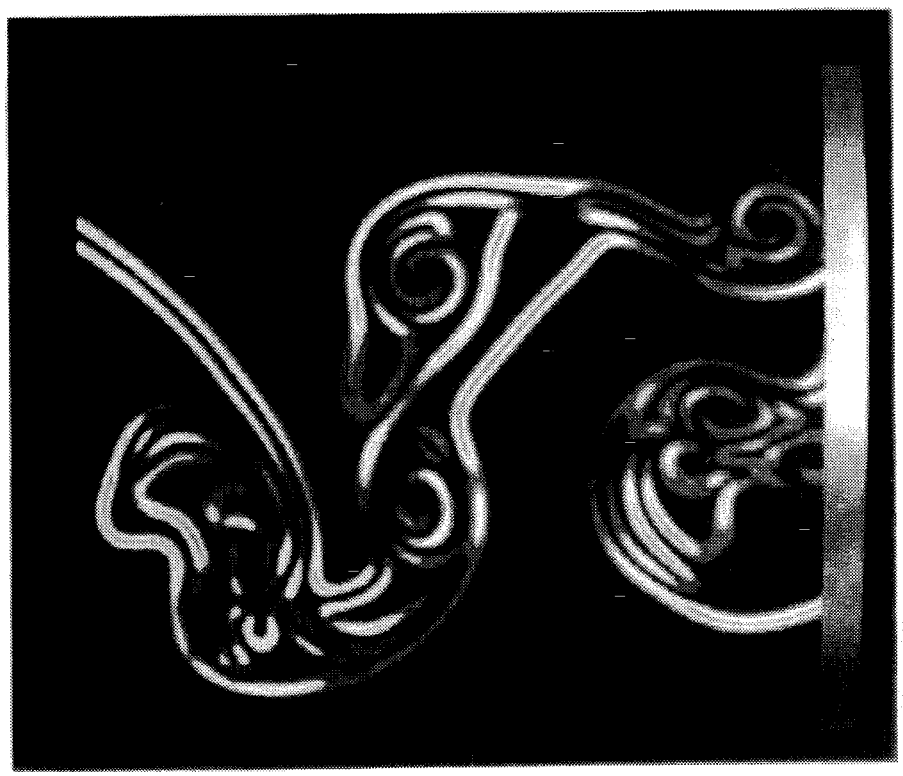
FIG. 26b shows a graphic visualization of the detailed LIM model results according to one preferred embodiment of this invention, for the scalar energy dissipation rate field in the right half of the field shown in FIG. 23.
Figure 29:
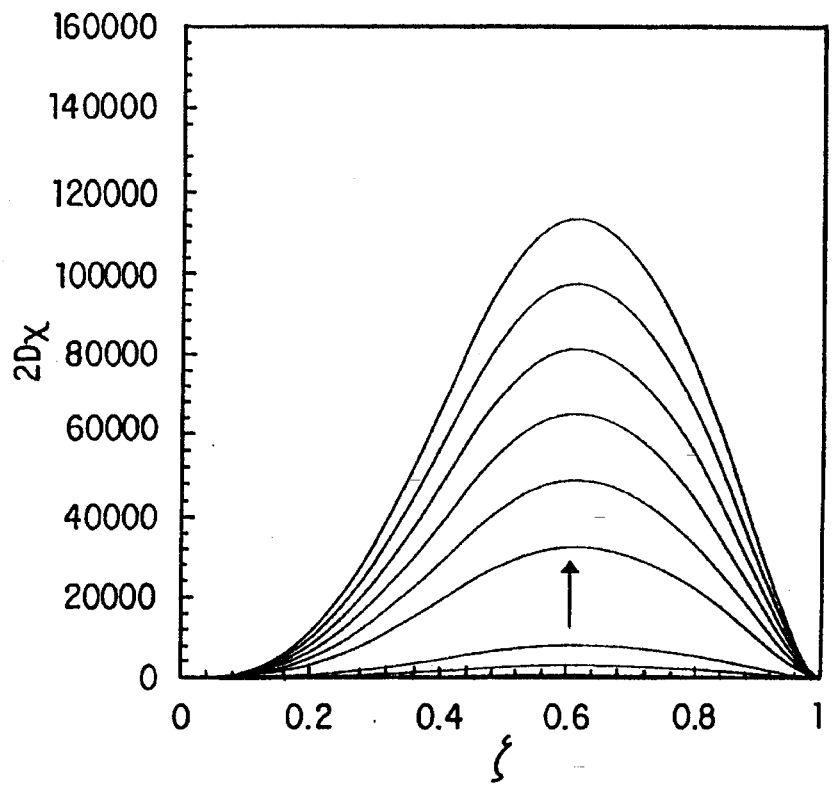
FIG. 29 shows an analytical mapping over the entire range of conserved scalar values, which is used with the results shown in FIGS. 26a and 26b to implement a flamelet library approach for nonequilibrium combustion calculations using relatively detailed reaction kinetics.
Figure 35A:
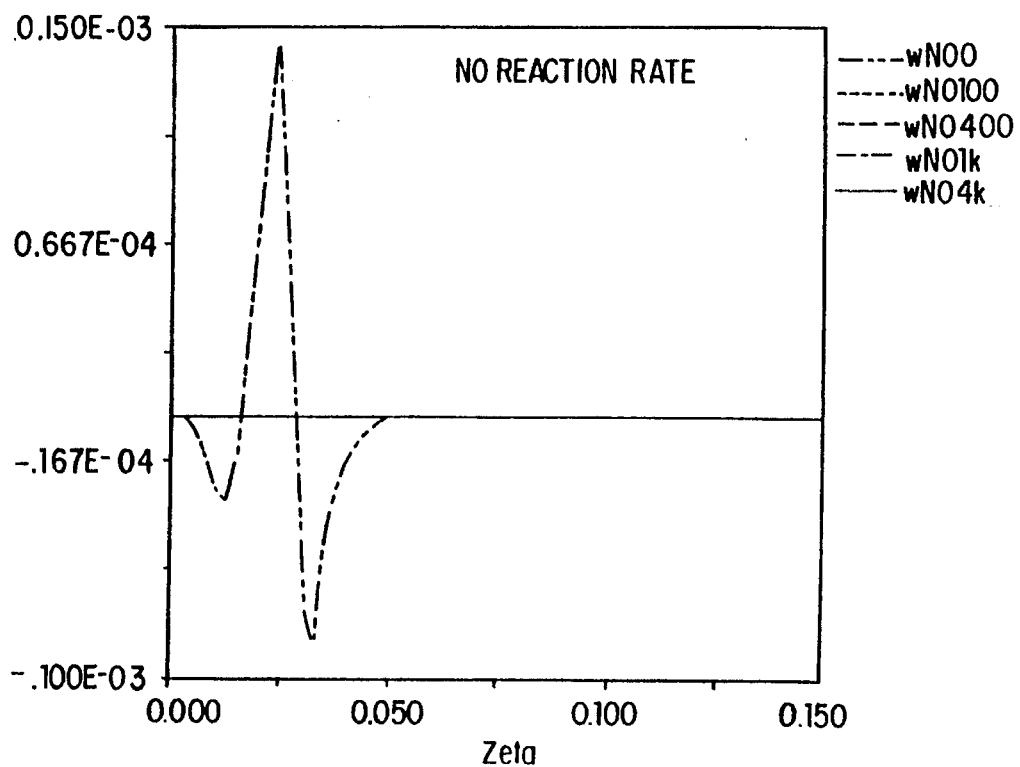
FIGS. 35a–35c show graphical representations of NO reaction rate profiles in conserved scalar space for values of the strain rate ranging from equilibrium to extinction.
Figure 35B:
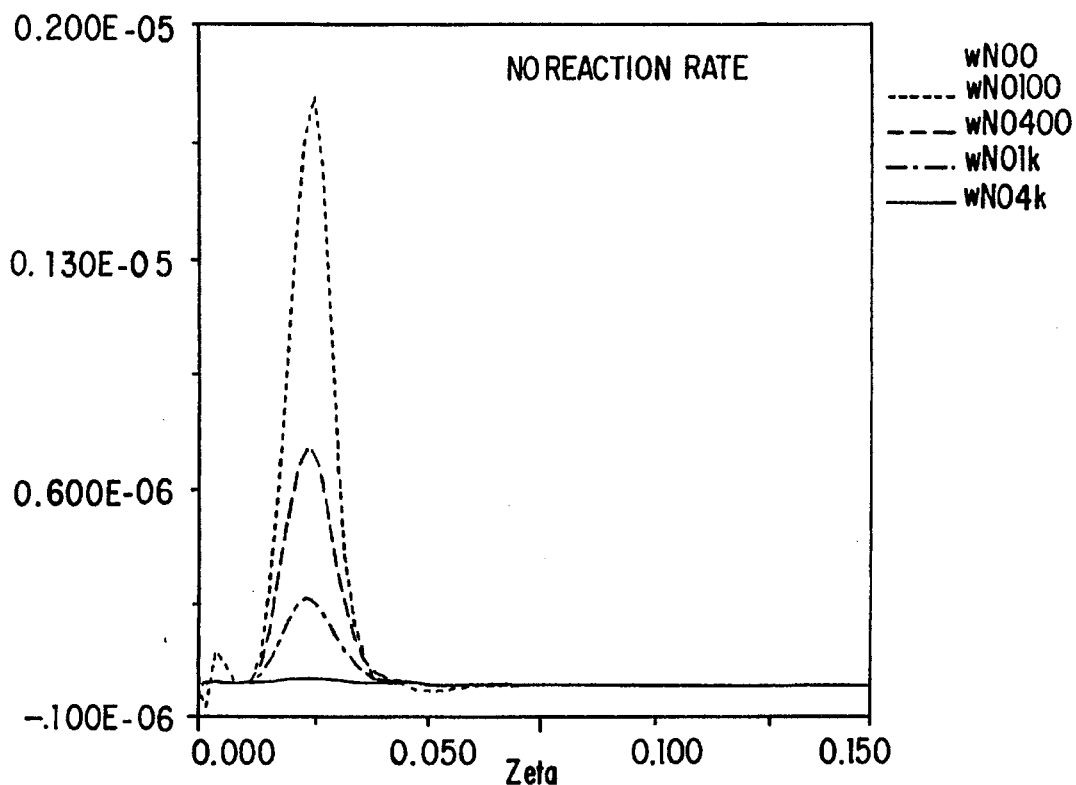
Figure 35C:
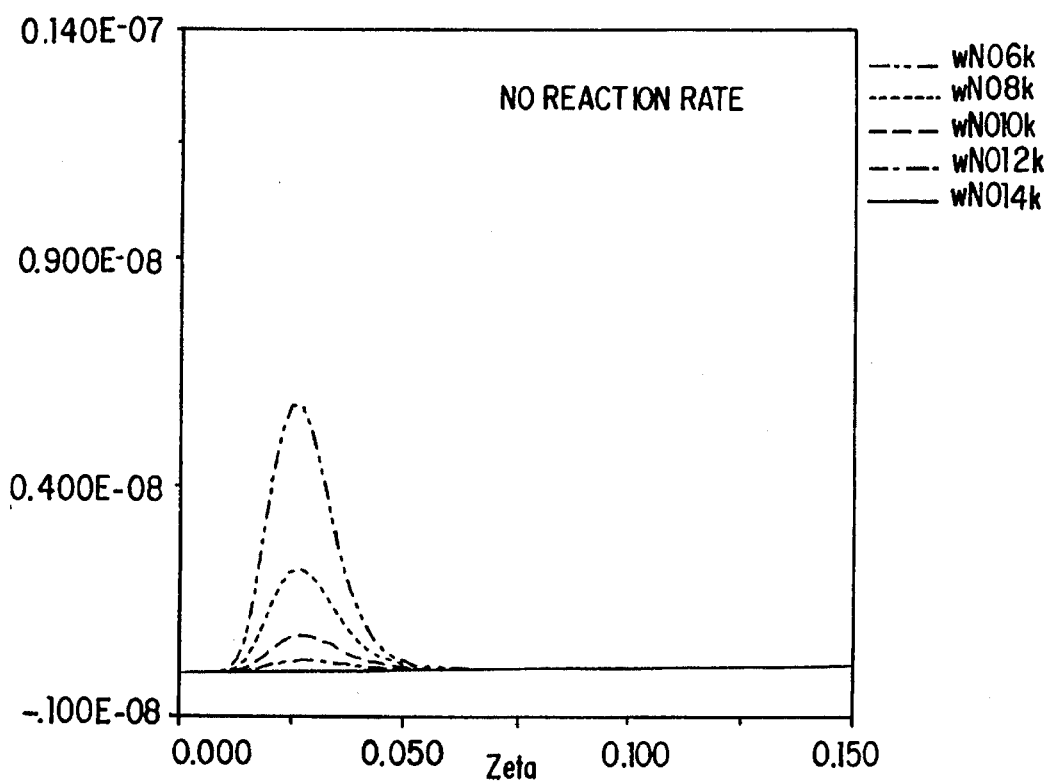
Figure 36:
Figure 37:
FIG. 37 is a graphic visualization of the OH reaction rate field computed by the LIM model according to this invention, corresponding to the OH concentration field shown in FIG. 36.
Figure 38:
FIG. 38 is a graphic visualization of the NO mass fraction field computed by the LIM model according to this invention, for the same conditions as the OH results shown in FIGS. 36 and 37.
Figure 39:
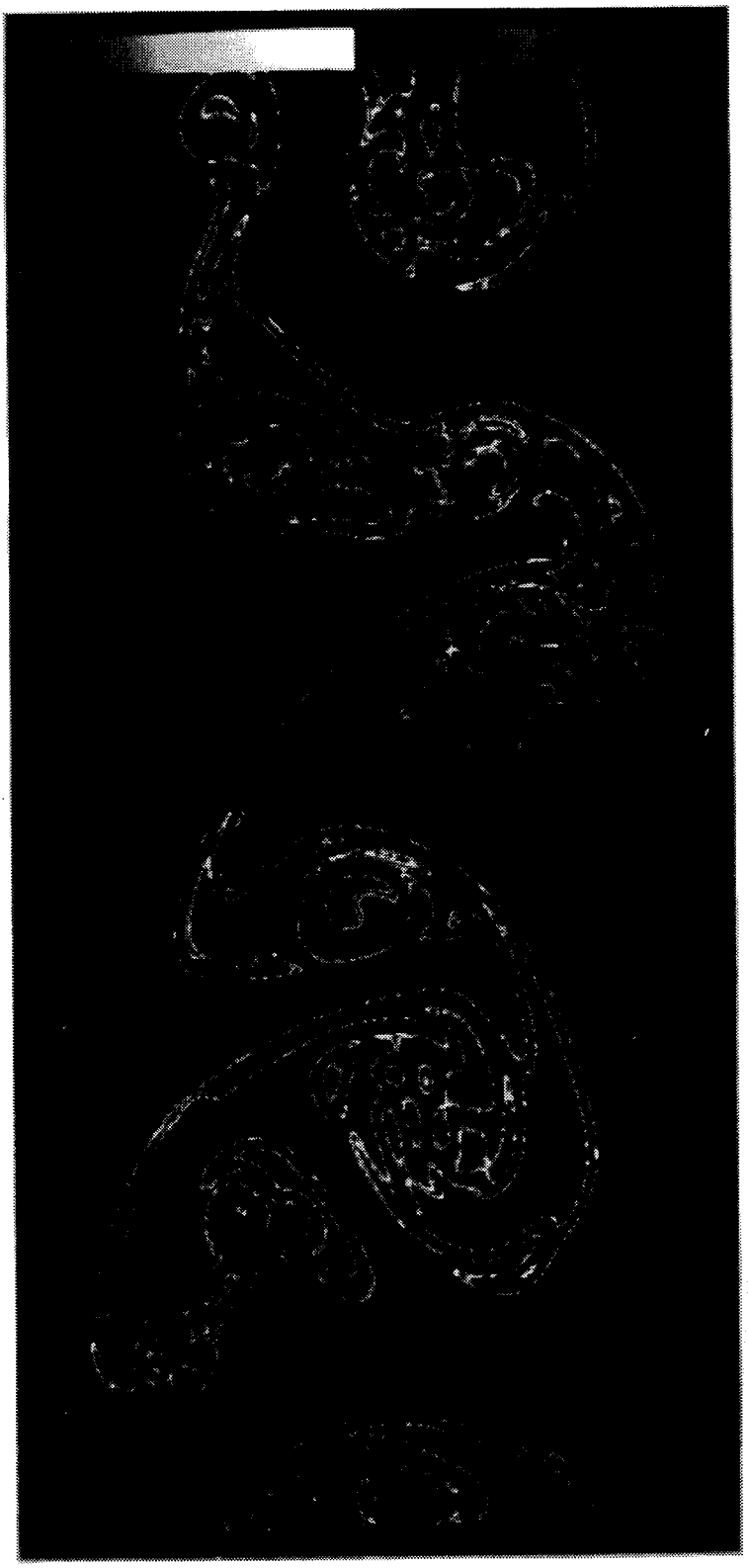
FIG. 39 is a graphic visualization showing the NO reaction rate field computed by the LIM model according to this invention, corresponding to the NO concentration field shown in FIG. 38.

The OH mass fraction field computed by the LIM model of this invention via the scalar and scalar dissipation rate fields in FIGS. 26a and 26b, the strain rate mapping in FIG. 29, and the OH mass fraction library in FIG. 30a is presented in FIG. 36. The detailed fine structure of the OH field requires a graphic visualization of the results of the type shown in FIG. 26. For this reason, the values of the OH mass fraction are shown with 256 linearly increasing color levels, beginning at pure black (zero OH) and ranging from pure blue to pure red (maximum OH concentration). The OH reaction rate field computed by the LIM model of this invention, corresponding to the OH concentration field shown in FIG. 36, is shown in FIG. 37. Again, values of the OH reaction rate are denoted by 256 linearly increasing color levels, beginning at pure black (zero OH reaction rate) and ranging from pure blue to pure red (maximum OH reaction rate). FIG. 38 shows the NO mass fraction field computed by the LIM model of this invention for the same conditions as the OH results in FIGS. 36 and 37. Shown are values of the NO mass fraction denoted by the 256 linearly increasing color levels, beginning at pure black (zero NO) and ranging from pure blue to pure red (maximum NO concentration). As shown in FIG. 34, the sharp decrease in NO concentration with increasing strain rate allows only the high NO concentrations corresponding to points close to equilibrium to be seen. Similarly, the NO reaction rate field computed by the LIM model of this invention is shown in FIG. 39, corresponding to the NO concentration field shown in FIG. 38. This gives values of the NO reaction rate denoted by the same 256 linearly increasing color levels, beginning at pure black (zero NO reaction rate) and ranging from pure blue to pure red (maximum NO reaction rate). As shown in FIGS. 35a–35c, the sharp drop in NO reaction rates with increasing strain rate renders only the reaction rates near equilibrium visible with this color assignment scheme. Results of this type obtained from the LIM model according to this invention can be used as a tool for understanding the $NO_x$ formation and reduction processes in turbulent flames of natural gas.

Extension to Combustion in Methane-Air Flames

It is apparent that the LIM model according to this invention can be used to implement a library for computations of methane-air flames. Although it is apparent that natural gas contains significant amounts of components other than methane, a methane-air library should provide an immediately useful tool for proceeding with natural gas computations via the LIM model according to this invention.

A conserved scalar/scalar dissipation rate formulation for complex nonequilibrium chemistry is incorporated into the LIM code of this invention. This formulation allows highly complex reaction chemistry to be addressed by such LIM code. Such detailed kinetics appears to be necessary to predict many trace emission levels from turbulent natural gas flames. No other conventional computational approach can accurately deal with the physics of the molecular mixing process and at the same time allow complex chemistry to be computed.

The flamelet implementation of the LIM model according to this invention has been successfully applied to treat nonequilibrium combustion in flames. It is important to note that in this implementation of the LIM approach no modeling beyond the initial parabolization of the governing equations is needed. In particular, no profile shapes need to be specified to close reaction integrals in the LIM equations. Instead, the tracking of the conserved scalar field proceeds comparatively model-free, and from this the resulting mass fraction and reaction rate fields can be computed. Results obtained according to the method of this invention show both the accuracy and the generality of the model, and indicate the type of new information about the combustion processes in flames that is computationally accessible with such modeling approach.

While in the foregoing specification this invention has been described in relation to certain preferred embodiments thereof, and many details have been set forth for purpose of illustration it will be apparent to those skilled in the art that the invention is susceptible to additional embodiments and that certain of the details described herein can be varied considerably without departing from the basic principles of the invention.

What is claimed is:

1. A computer program embodied on a computer-readable medium for determining molecular diffusion and chemical reaction within a material by determining species concentrations and reaction rates of nonequilibrium combustion in a turbulent reacting flow, the improvement comprising:

linearly separating a velocity field of the turbulent reacting flow into a curl-free part and a divergence-free part;

tracking the divergence-free part of the turbulent reacting flow by solving, at a plurality of first points on a first material surface, a first parabolized form of a first differential equation reduced from and approximating a more complex governing first partial differential equation;

treating as negligible the curl-free part of the turbulent reacting flow;

determining a shape deformation value of a second material surface over time as a function of the tracked divergence-free part;

determining a rate of stretch of the second material surface as a function of the shape deformation value;

relating the rate of stretch to mixing of at least one conserved scalar quantity in the turbulent reacting flow by solving, at a plurality of second points on the second material surface, a second parabolized form of a second differential equation reduced from and approximating a more complex governing second partial differential equation;

determining a gradient field of conserved scalars in the turbulent reacting flow as a function of the second solved differential equation;

calculating conserved scalar values from the gradient field of conserved scalars; and determining a species concentration and a reaction rate of the nonequilibrium combustion by correlating the calculated conserved scalar values and the determined gradient field of conserved scalars with corresponding values of a flamelet library.

2. The method according to claim 1 wherein a plurality of discrete vortex elements that locally satisfy the first parabolized form of the first differential equation are used to track a vorticity vector field of the divergence-free part of the flame flow.

\* \* \* \* \*